United States Patent [19]

Lazzari et al.

[11] Patent Number: 4,851,018

[45] Date of Patent: Jul. 25, 1989

[54] INSTALLATION FOR THE STORAGE AND TRANSFER OF OBJECTS IN A VERY CLEAN ATMOSPHERE

[75] Inventors: Jean-Pierre Lazzari, Corenc; Henri Cortial, Sassenage, both of France

[73] Assignee: Commissariat A l'Energie Atomique, Paris, France

[21] Appl. No.: 123,355

[22] Filed: Nov. 20, 1987

[30] Foreign Application Priority Data

Nov. 28, 1986 [FR] France .............................. 8616653
Sep. 4, 1987 [FR] France .............................. 87 12292

[51] Int. Cl.⁴ .................... B01D 46/10; B65B 1/04
[52] U.S. Cl. ...................... 55/356; 55/385.2; 55/471; 55/473; 55/DIG. 29; 414/217
[58] Field of Search ............ 414/225, 222, 217; 55/276, 356, 385.2, 471–473

[56] References Cited

U.S. PATENT DOCUMENTS

| | | | |
|---|---|---|---|
| 4,540,326 | 9/1985 | Southworth et al. | 414/217 |
| 4,553,069 | 11/1985 | Purser | 414/225 X |
| 4,619,573 | 10/1986 | Rathmann et al. | 414/222 |
| 4,649,830 | 3/1987 | Tanaka | 414/217 X |
| 4,668,484 | 5/1987 | Elliott | 414/217 X |
| 4,674,936 | 6/1987 | Bonora | 414/217 |
| 4,674,939 | 6/1987 | Maney et al. | 414/217 X |
| 4,676,884 | 6/1987 | Dimock | 414/222 X |
| 4,682,927 | 7/1987 | Southworth et al. | 414/225 X |
| 4,687,403 | 8/1987 | Motoda | 414/225 X |
| 4,687,542 | 8/1987 | Davis et al. | 414/222 X |
| 4,715,764 | 12/1987 | Hutchinson | 414/225 X |
| 4,724,874 | 2/1988 | Parikh et al. | 414/217 X |

FOREIGN PATENT DOCUMENTS 0195703 9/1986 France .

OTHER PUBLICATIONS

British Kinematography Sound and Television, vol. 53, No. 4, Apr. 1971, pp. 122–126, 131, Londres, GB; R. N. Haig: "Environmental and Contamination Control".

*Primary Examiner*—Robert Spitzer
*Attorney, Agent, or Firm*—Oblon, Spivak, McClelland, Maier & Neustadt

[57] ABSTRACT

The installation according to the invention includes a cabinet for storing objects, apparatus for processing these objects, apparatus for transferring these objects between the storage cabinet and processing apparatus for the same, constituted by mobile containers and fixed containers fixed to the processing apparatus. The mobile containers can be coupled to the cabinet and to the fixed containers in order to carry out the transfer of the object to be processed. The installation also includes apparatus for ventilating the interior of the installation in order to permanently subject the objects to a very clean gas flow. This apparatus can be constituted by fans, by internal filters, or by an external pressurized ultraclean gas source.

33 Claims, 11 Drawing Sheets

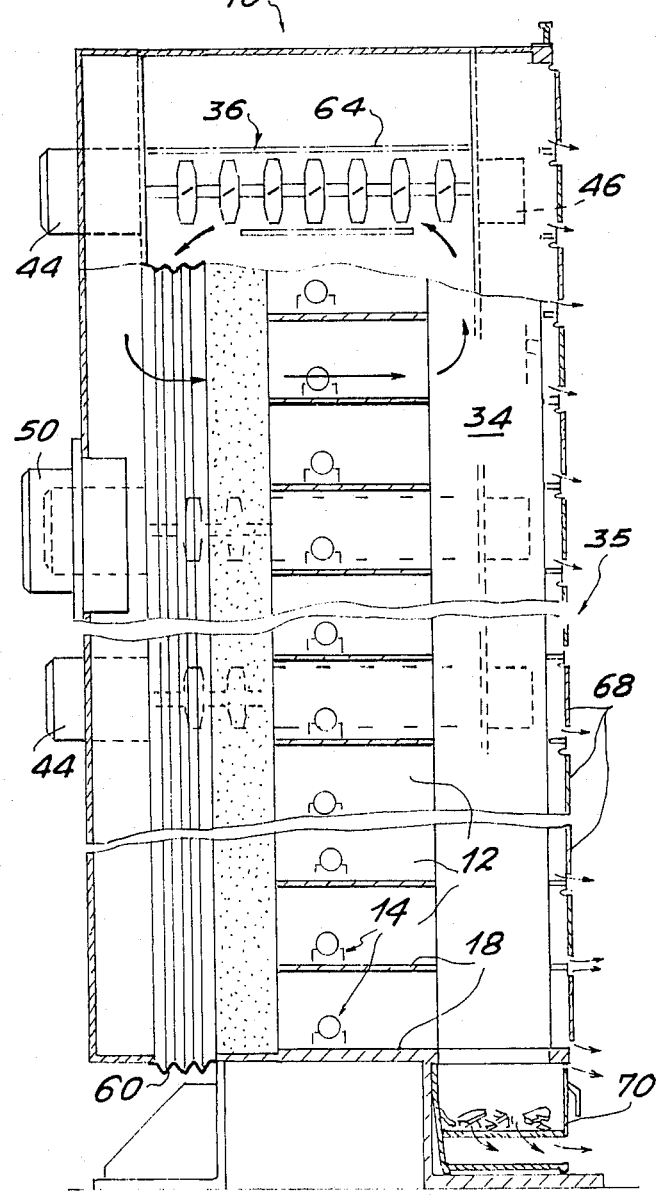

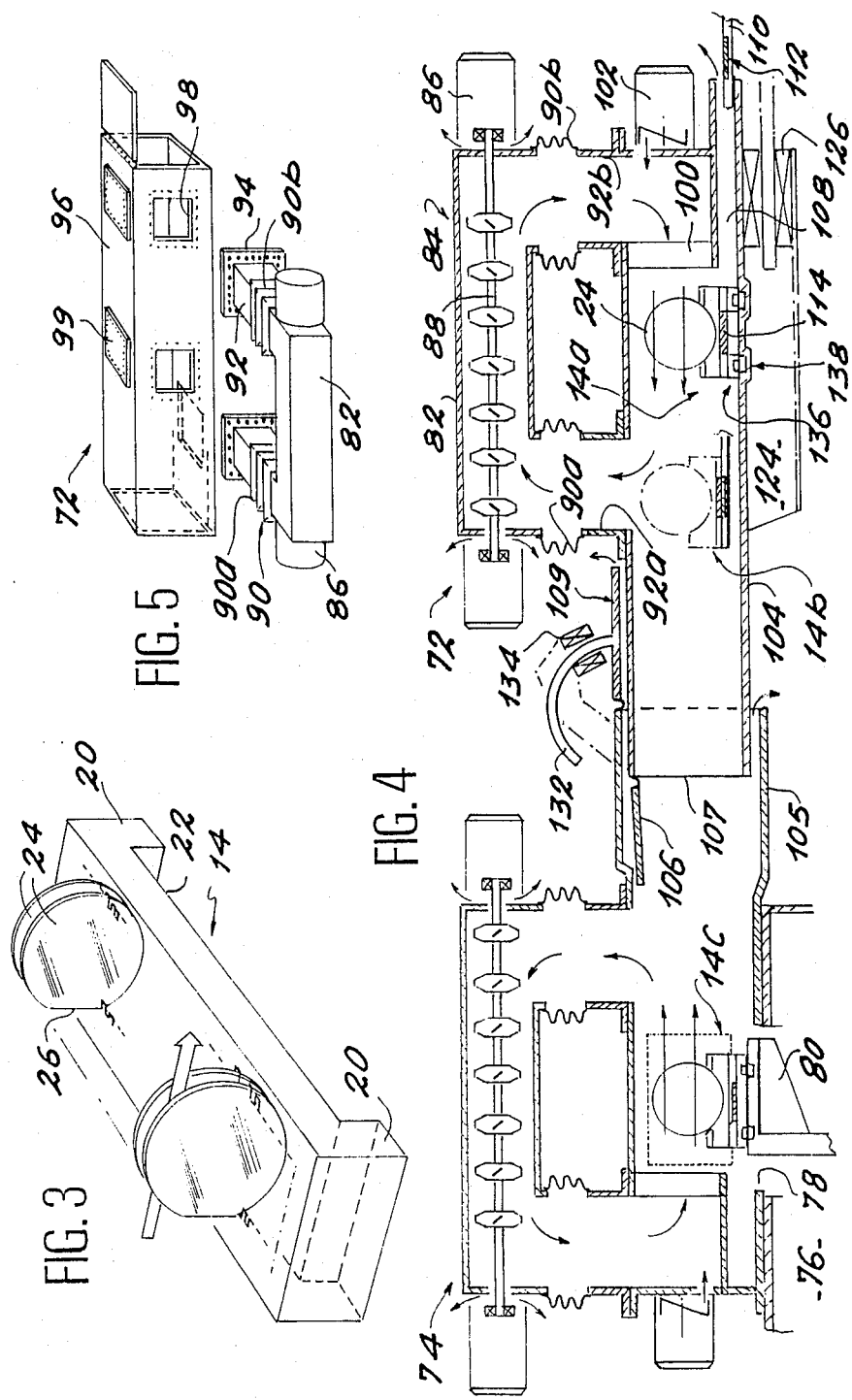

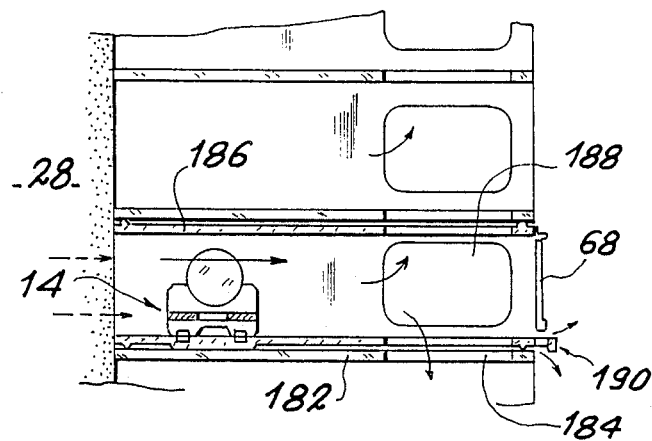
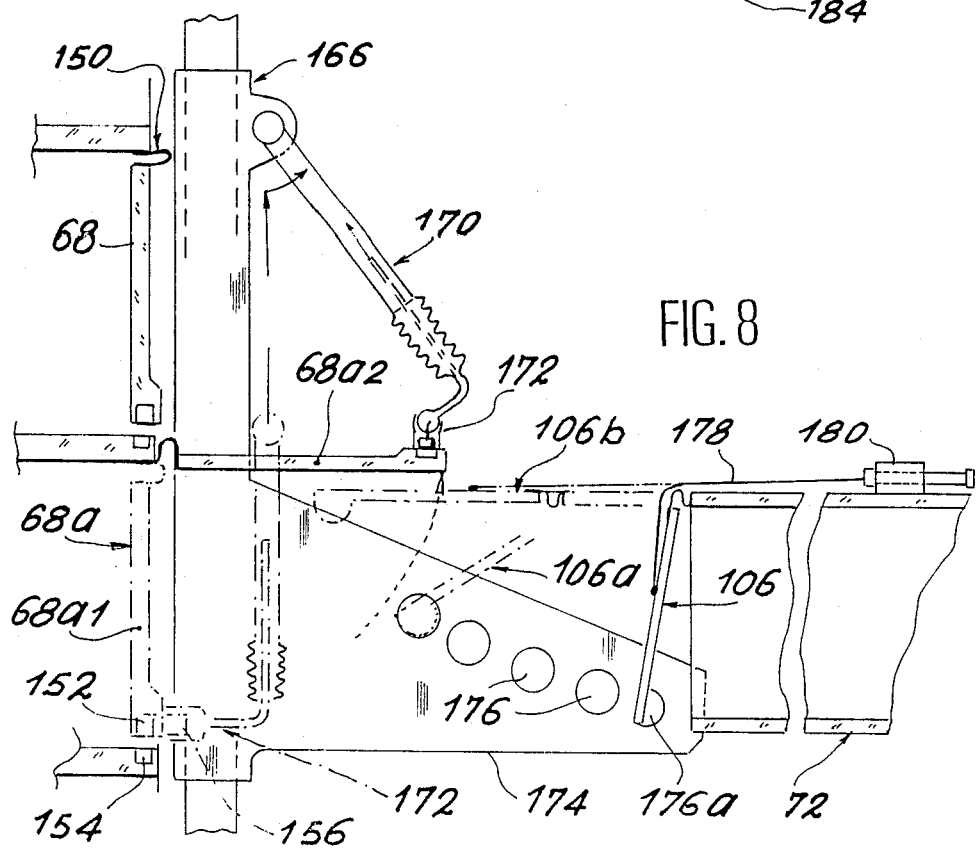

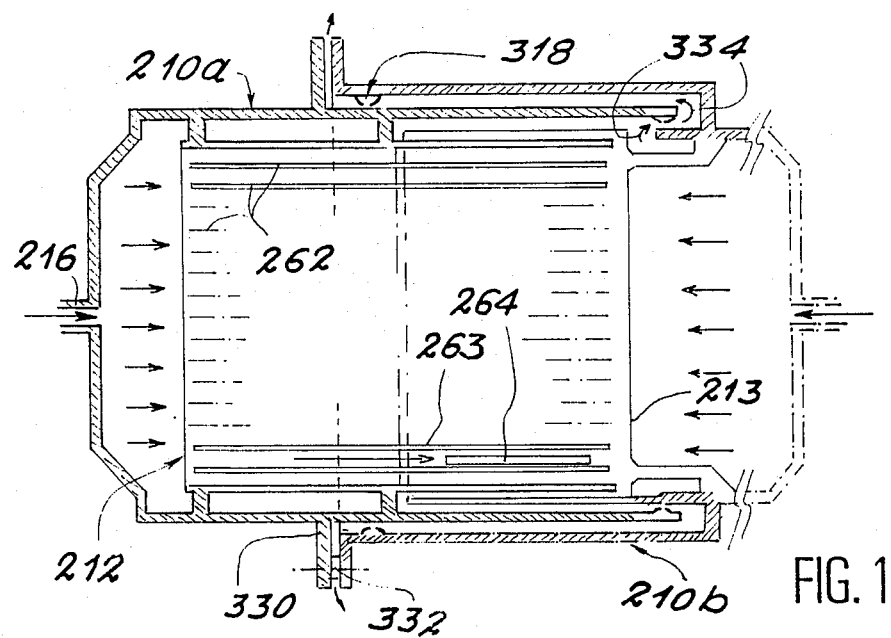
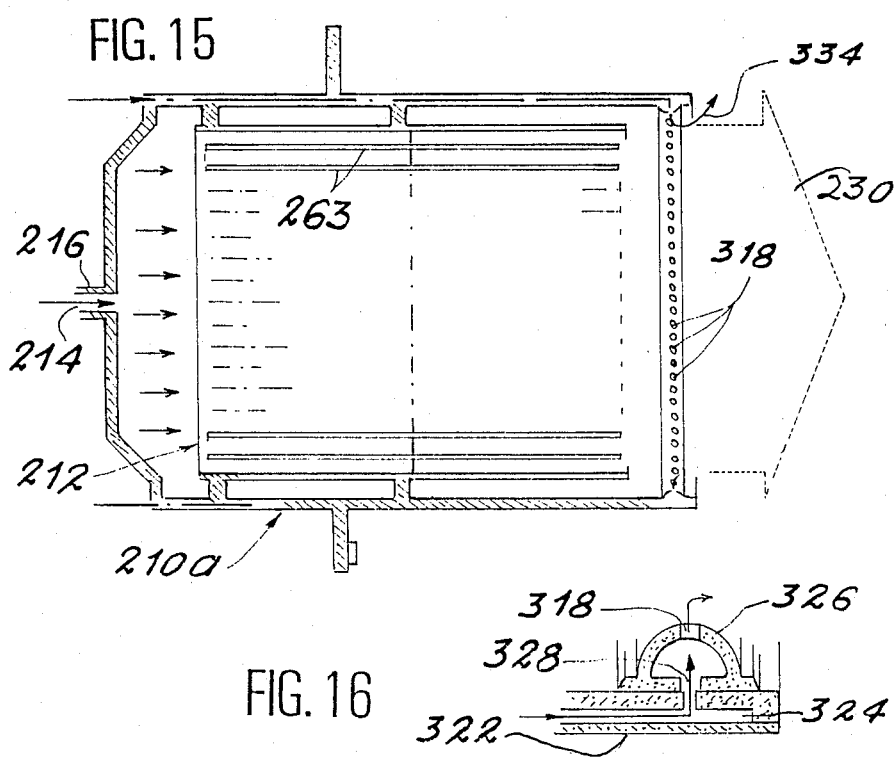

INSTALLATION FOR THE STORAGE AND TRANSFER OF OBJECTS IN A VERY CLEAN ATMOSPHERE

FIELD OF THE INVENTION

The present invention relates to the field of the ventilation of rooms or areas within which the air must be very clean and more particularly applies to the microelectronics industry.

BACKGROUND OF THE INVENTION

It is pointed out that, in industries such as microelectronics, certain operations such as the preparation of silicon wafers or chips must be performed in an atmosphere which is free from impurities or dust i.e., in so-called white rooms. This is obtained by ventilating the rooms with air which has been filtered with absolute filters, i.e., filters which stop all dust, even that of an extremely fine nature. At present there are four main methods for maintaining the purity of the air in microelectronics white rooms.

In the first type of white room, the air is introduced into it through the ceiling, and the flow there is of a laminar nature. Personnel works in the room, which also houses equipment. However, efforts are made to reduce the volume occupied by the equipment in the white room. Therefore, the various machines or pieces of equipment are positioned through a tight partition, so that part of them is located in the white room and the remainder in a room where the cleanness requirement is not as high. The main disadvantage of this solution is the need to have a very large clean air volume, and the volume of the air treatment rooms is often three to four times greater than the volume of the actual white room. The installation and operation costs are consequently very high, and the heaviness of the structure does not make it possible to change equipment. Finally, this type of white room suffers from clothing constraints for the personnel.

Because of the foregoing disadvantages of the first type of white room, use is made of another type of white room structure in which the personnel, who generate particles and therefore dust, are replaced by robots. Although the reduction of personnel present in the room makes it possible to obtain a higher cleanness level, robots themselves generate dust, although to a lesser degree than human beings. Moreover, there is only a small reduction in personnel numbers, because the actual handling of the silicon chips only takes up less than 10% of the total working time of employees. Thus, this solution, which requires significant changes in the rooms and to the equipment, is not really commercially viable.

A third solution consists of connecting the different pieces of equipment with the aid of a tube in which the silicon chips circulate by means of an automatic carriage. An ultraclean environment is maintained within the tube and not in the room. Thus, the employees are located in an environment where the degree of cleanness is lower, but which constitutes less of a constraint, whilst the ventilation system installation and operating costs are reduced. However, this solution also leads to disadvantages. Firstly, once the tube has been installed, modifications are only possible with difficulty. Moreover, its connection to the various pieces of equipment or machines make machine modification or changing operations difficult. Finally, the carriages circulating within the tubes are complex, generate dust and are difficult to maintain.

Because of the foregoing disadvantages of the third type of white room, another system has been adopted in which the silicon chips are enclosed in tight boxes for transferring the same into the treatment or processing room. The atmosphere within the tight boxes is of a very high purity level, whereas in the room the purity or cleanness level is of an average nature. The transfer between boxes or between a box and a machine takes place by means of a system of slides or slide valves, which prevent the introduction of external particles or dust into the tight containers. Although this solution has the advantage that the ventilation apparatuses are relatively simple (due to the only average cleanness of the room) and although the use of tight boxes does not lead to all the complications due to the existence of tubes, the fourth solution still suffers from certain disadvantages. Firstly, the silicon chips placed in the boxes are under isostatic environmental conditions, which means that there is little or no air movement. Under these conditions, the particles which could be present in the vicinity of the chips are mainly subject to electrostatic attraction forces developing on the surface of the chips and on the inner walls of the boxes. As the total surface of the silicon chips is much larger than that of the inner walls of the boxes, the particles are mainly deposited on the chips. This is a very significant disadvantage, because when a particle with a diameter of approximately 0.2 micrometer is stuck to a clean surface, it is virtually impossible to disengage it therefrom. Moreover, the system of slides for transferring the chips from one box to the other, or from a box to given pieces of equipment, must be very precise. The operations are accompanied by friction, which can lead to the tearing away of particles, and the latter may then be stuck to the chips. Finally, the various production equipments must be equipped with containers similar to the tight boxes used for transfer, and the installation of these containers is expensive and complex.

OBJECTS OF THE INVENTION

The object of the present invention is to obviate the disadvantages of the four previously known white room by proposing an installation for the storage and transfer of objects in a very clean atmosphere which is simpler and less expensive to realise than those of the prior art.

The main object of the invention is an installation for the storage and transfer of objects with a view to the treatment or processing thereof in a very clean atmosphere which is placed in a room having an average cleanness level. The installation comprises means for storing the objects, means for processing the objects and means for transferring the objects, between the storage and processing means.

SUMMARY OF THE INVENTION

The invention is characterized in that the transfer means are constituted by at least one movable container, which can be coupled to the storage means and to the processing means. Additionally, the invention comprises means for ventilating the complete interior of the installation in order to permanently subject the objects to a very clean gas flow.

One of the main elements of the invention is a ventilated cabinet or cubicle constituting the storage means for the objects.

Another important feature of the installation according to the invention is that the transfer means also comprise at least one fixed container used for the introduction of the objects into a processing machine.

Another feature of the invention is that the fixed and mobile containers can be coupled together to permit the passage of objects between them. In the same way, the mobile container can be coupled to the cabinet to permit the transfer of objects from one to the other.

According to a first embodiment of the installation according to the invention, the ventilation means are constituted by fans placed in the cabinet and in the containers. The overpressure is obtained in the same way.

According to a second embodiment of the installation according to the invention, the ventilation and overpressure means are constituted by orifices making it possible to link the interior of the installation with an external source of pressurized, ultraclean gas.

BRIEF DESCRIPTION OF THE DRAWINGS

FIG. 2 is a diagrammatic profile view in vertical section of the cabinet of FIG. 1.

FIG. 3 is a diagrammatic perspective view of a basket used for supporting the processed objects (which in the illustrated embodiments are silicon chips).

FIG. 4 is a diagrammatic vertical sectional view illustrating two containers according to a first embodiment of the invention, whereof one is mobile and is used for transferring silicon chips, whilst the other is fixed and serves as a lock for the introduction of chips into a machine.

FIG. 5 is a diagrammatic perspective view showing certain components of the containers illustrated in FIG. 4.

FIG. 8 is a diagrammatic vertical sectional view on a larger scale illustrating the opening of the doors of the front panel of the cabinet.

FIG. 9 is diagrammatic vertical sectional view illustrating another possible configuration for the racks or cavities for storing the chips in the cabinet.

FIG. 15 is a diagrammatic vertical sectional view of a container according to the second embodiment of the invention and in which the door is replaced by an air curtain.

FIG. 16 is a diagrammatic sectional view showing the arrangement of nozzles serving to produce the air curtain in the container of FIG. 15.

FIG. 17 is a view similar to FIG. 15, but showing the coupling of two containers of this type.

DETAILED DESCRIPTION OF THE PRESENTLY PREFERRED EMBODIMENTS

Relative to FIGS. 10 to 17, relating to a second possible embodiment of the fixed and mobile containers and the passages in the description relating thereto, the same terms as are used in connection with the first embodiment will be used for designating parts, assemblies, or objects of an identical nature i.e., objects fulfilling the same functions.

The main elements constituting an installation according to the invention are the means for storing the objects (constituted by a cabinet), the means for processing the objects (constituted by processing machines or working stations), and the means for transferring the objects between the cabinet and the processing machines (constituted by fixed and mobile containers).

THE FIRST EMBODIMENT

Figure 1:
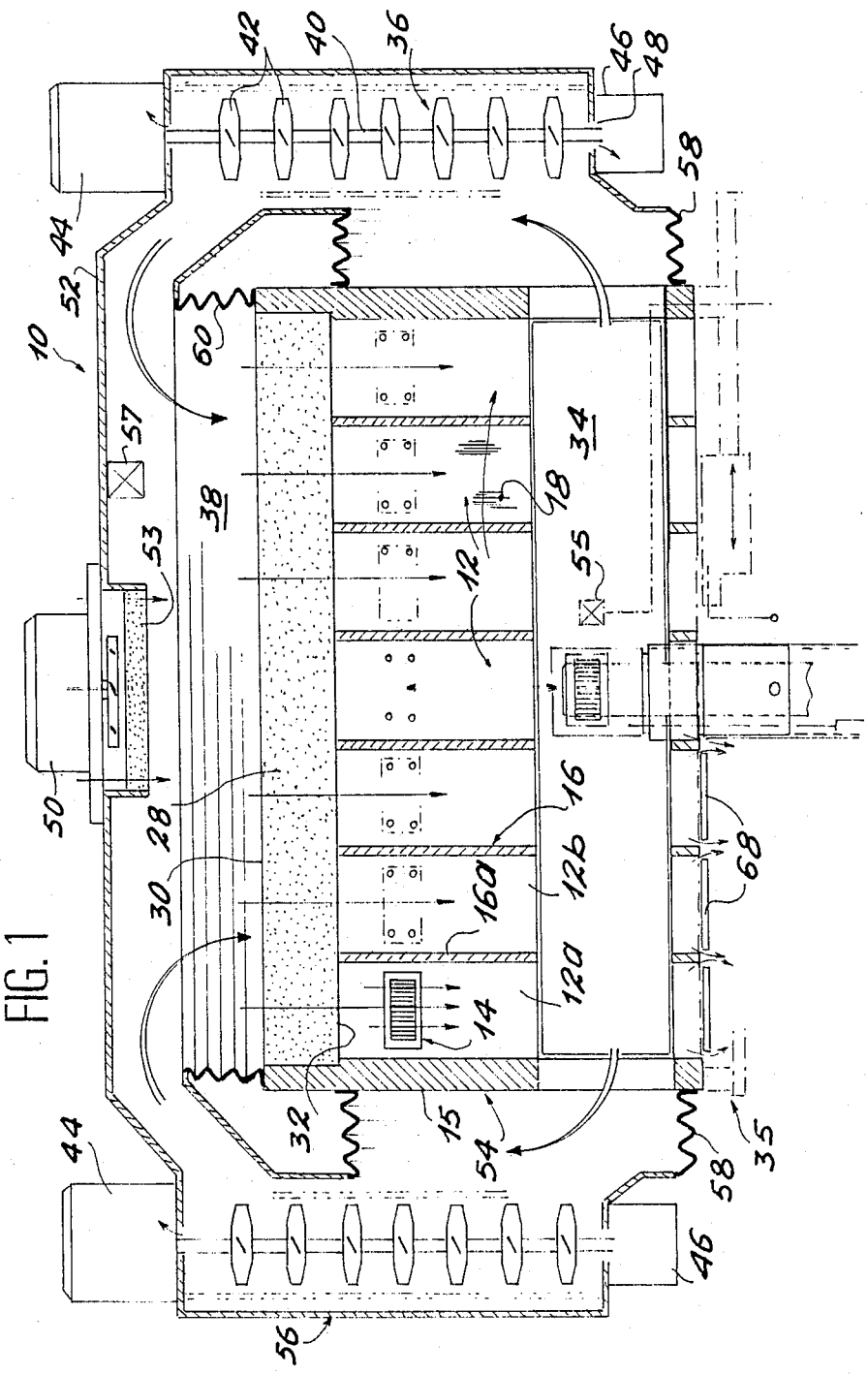
FIG. 1 is a diagrammatic cross-sectional view of a storage cabinet used in the installation according to the invention.

FIGS. 1 and 2 illustrate a storage cabinet 10 according to the invention used for chips made from silicon or some other material (e.g., gallium arsenide). The storage cabinet 10 has a certain number of cavities or racks 12, in each of which is stored a basket 14 containing silicon chips. Each rack 12 is defined by two vertical partitions 16, which separate each rack 12 from adjacent racks, and by a horizontal floor 18 on which the basket 14 is placed. The racks 12 are arranged in horizontal rows. All the floors 18 of the racks 12 of each row are located at the same height, and there are several superimposed rows. A rack 12 located at the end of a row (such as, e.g., rack 12a) is bounded on one side by a partition 16a, which separates it from the adjacent rack 12b of the same row, and on the other side by a wall 15. The dimensions of the racks 12 are dependent on the capacity of the baskets 14 (the latter generally containing 25 or 50 chips) and the diameter of the chips. For example, for chips having a diameter of 4", the height of the racks 12 can be 12 cm, and their widths can be 18 cm.

The perspective view of FIG. 3 shows a particular basket configuration for facilitating the handling and transfer of a basket 14 during transfer operations between the storage cabinet 10 and the processing machines. (The transfer operations will be described hereinafter.) It can be seen that the basket 14 is shaped like an elongated support having at its two ends feet 20 between which is located a slot 22 permitting the passage of a handling means. Chips 24 are placed in recesses provided on the upper surface of the basket 14; the plane of the chips 24 being vertical when the basket 14 is placed on a horizontal support. The shape of the basket 14 is such that the surface of the chips 24 in contact with their support is as small as possible. Such supports are known per se and will not be described in detail here. FIG. 3 also shows that each chip 24 has a flat 26 used for indicating the crystal orientation of the chip 24 and for facilitating its correct positioning in the treatment or processing machines.

On referring once again to FIG. 1, it can be seen that ventilation means are inventively provided within the storage cabinet 10 in order to permanently subject the objects stored to a very clean gas flow. Thus, a filter or a set of filters 28 is placed at the rear of the racks 12. In the particular case described here, the filter 28 is of an absolute nature and has an upstream face 30 and a downstream face 32, the upstream and downstream faces of the filter 28 being vertical. The vertical partitions 16, as well as the horizontal floor 18, are in contact, at one of their ends, with the downstream face 32 of the filter 28, in such a way that each rack 12 is closed at its corresponding end by the filter 28.

Fans, which will be described hereinafter, make it possible to circulate the air within the storage cabinet 10 in such a way that the air passes through the filter 28 by its upstream face 30 and leaves it by its downstream face 32. The baskets 14 are placed on the horizontal floor 18 in the immediate vicinity of the downstream face 32 of the filter 28 and are positioned in such a way that the plane of the chips 24 (i.e., their planar surfaces) are parallel to the air flow direction when it leaves the filter 28. This offers a double advantage. The first advantage is that air which has passed through an absolute filter (i.e., very clean air) sweeps over the chips 24. The second advantage is that, as the outflow direction is parallel to the planar surfaces of the chips 24, the air has the effect of eliminating any dust which might have been deposited thereon. The length of the racks 12 is sufficient to ensure that, downstream of the baskets 14 with respect to the air flow direction, there is a length of approximately 30 cm, so as to ensure that the turbulence of the air leaving the racks 12 does not disturb the immediate environment of the chips 24.

The air leaves the racks 12 by the end thereof opposite to the filter 28, which is open. Thus, it arrives in a front space 34 in the storage cabinet 10. The front space 34 is limited, on a side opposite to the racks 12, by the front panel 35 of the storage cabinet 10. The front panel 35 is vertical and placed parallel to the rows of racks 12. (The front panel 35 will be described hereinafter.) The front space 34 is open at each of its ends corresponding to the ends of a row of racks 12. Thus, it communicates by spaces located between the front panel 35 and walls such as the wall 15 with cases containing fans such as 36. The fans 36 are positioned in such a way as to draw in the air located in the front space 34 and to discharge it into a rear space 38 of the storage cabinet 10. The dimensions of the rear space 38 are determined so as to homogenize the pressure of the air before the latter enters the absolute filters 28.

In the preferred embodiment described here, the fans 36 essentially comprise a shaft 40 along which are mounted several groups of blades 42, a drive motor 44, and bearings 46 for the shaft. In order to avoid the transmission of vibrations to the storage cabinet 10, the drive motor 44, and the bearings 46 are located outside the storage cabinet 10. The shaft 40 traverses the cabinet walls through openings 48, the sections of which are larger than the sections of the shaft 40. This arrangement has a double advantage. First, there is no contact between the shaft 40 and the cabinet wall (so the vibrations due to the rotary movement of the shaft 40 are not transmitted to the cabinet wall). Second, as the storage cabinet 10 is mostly maintained under overpressure with respect to the room, the air can flow from the inside to the outside thereof through the openings 48.

In order to obtain a dynamic sealing of the storage cabinet 10, it is kept under an overpressure with respect to the treatment room. An auxiliary fan 50 is fitted to a rear wall 52 of the storage cabinet 10. The auxiliary fan 50 takes air from the room and blows it into the storage cabinet 10 through a filter 53 placed in an orifice in the rear wall 52. The auxiliary fan 50 is controlled by means of two pressure sensors, whereof one (not shown) is positioned outside the storage cabinet 10 and the other 55 inside the storage cabinet 10 (namely, in the front space 34). It is advantageously possible to provide a temperature and relative humidity regulator 57 in the rear space 38 of the storage cabinet 10.

The parts of the storage cabinet 10 where the fans 36 are located can be the source of vibrations. Although the vibrations are not prejudicial to the stored chips 24, all mechanical friction must be prevented, because vibrations generate particles. Therefore the storage cabinet 10 is made from two main parts namely, a first rigid case 54 containing the racks 12, the absolute filters 28, and the front panel 35 and a second rigid case 56 surrounding the first rigid case 54 on the sides and the rear thereof. In order that the vibrations produced in the second rigid case 56 by the fans 36 are not transmitted to the first rigid case 54 containing the racks 12, the two cases are joined to one another by flexible connections in the form of bellows. In the particular case described here, the connections are ensured by two lateral bellows 58 connecting the front space 34 of the storage cabinet 10 to the two areas where the fans 36 are located. Moreover, a third bellows 60 connects the rear part of the second rigid case 56 to the rear part of the first rigid case 54 in the vicinity of the upstream face 30 of the filter 28. This arrangement ensures a permanent recycling of the air contained in the storage cabinet 10 when the fans 36 are in operation. The air passes through the racks 12 from the filter 28 up to the front space 34, then passes from the front space 34 into those parts of the second rigid case 56 containing the fans 36 through the lateral bellows 58, and then from those parts of the second rigid case 56 into the rear space 38 of the storage cabinet 10 through the connection zones and from there up to the upstream face 38 of the filter 28 through the bellows 60. The bellows 58 and 60 are preferably fixed tightly to the first rigid case 54 and the second rigid case 56. However, if sealing is not perfect, this is not prejudicial to the extent that the storage cabinet 10 is under an overpressure compared with the outside. If there is a large number of rows of superimposed racks 12, as illustrated in FIG. 2, there can be several fans, such as 36, placed one above the other on either side of the storage cabinet 10. Optionally, in order to avoid turbulence, it is possible to place each fan 36, or at least that part of each fan 36 containing the blades 42, within a hollow cylinder 64 (FIG. 2). Preferably, the blades 42 are polished and metalized, so as to have a bright surface appearance, and the inner surface of the hollow cylinder 64 is polished in the same way as the blades 42 in order to prevent turbulence due to friction of the air on that surface.

It is pointed out that the internal volume of such a cabinet is relatively small compared with the volume of the room in which it is stored. Furthermore, according to a preferred embodiment of the invention, all the inner surfaces of the cabinet are lined (i.e., not only the inner face of the walls thereof, but also the surface of the shafts and the fan blades, as well as the partitions and the floors of the racks), with a thin layer of a material which is the constituent material of the chips (e.g., silicon). Thus, the air circulating within the cabinet is never in contact with a material other than silicon.

FIGS. 1 and 2 also show that the front panel 35 of the storage cabinet 10 has a certain number of doors 68. A door 68 faces each rack 12. Thus, it is merely necessary to open the door 68 corresponding to a given rack 12 and to take or remove the associated basket 14 by a gripping means located outside the storage cabinet 10. The doors 68 and the gripping means will be described in greater detail hereinafter in connection with the transfer of a basket 14 between the storage cabinet 10 and a processing machine. For example, the useful storage volume (i.e., all the racks 12) can have a height of 2.4 m and a width of 4.32 m. If the section of each rack 12 is 12×18 cm, it is possible to house 24 racks 12 in a row and to superimpose 20 rows (i.e., a total of 480 racks) for chips with a diameter of 4". If the baskets contain 50 chips, it is thus possible to store either 24,000 4" diameter chips, or 6,000 8" diameter chips.

When it is wished to deposit a basket 14 in its rack 12 or to remove a basket 14 from its rack 12, an incorrect manipulation may lead to the dropping of the basket 14 or of a few chips 24 in the basket 14. Thus, in the lower part of the front space 34 of the storage cabinet 10, there is a slide 70 which makes it possible to recover broken or dirty objects. The shape and dimensions of the slide 70 can be such that the air contained therein, which is under an overpressure compared with the room, can escape to the outside, either over the upper edge of the slide 70 or below the slide 70. In the latter case, the floor of the slide 70 can be perforated.

In order that the storage cabinet 10 is usable, no matter what the diameter of the chips 24 to be stored, each rack 12 is fixed in width (the width being a function of the number of chips 24 in the basket 14) and can be adjusted as regards its height. In the case of a diameter change of the chips 24 to be stored, the front panel 35 is dismantlable, so that it can be removed and replaced by another panel in which the doors 68 correspond to the new dimensions of the racks 12. Thus, only the racks 12 and the front panel 35 are modified, all the rest of the storage cabinet 10 remaining unchanged.

A description will now be given of an operation of transferring objects (i.e., chips), between the storage cabinet 10 and a processing machine with reference to FIGS. 4 to 9.

The vertical sectional view of FIG. 4 shows two containers, a transfer container 72 used for the transfer of chips 24 between the storage cabinet 10 and a machine 76 and a locking container 74 serving as a lock for the transfer of chips 24 between the transfer container 72 and the machine 76. In the embodiment described here, the locking container 74 is placed on the machine 76, and it communicates with the internal space of the machine 76 by an opening 78 provided in its lower wall. This opening permits the passage of an elevator 80 which forms part of the machine 76. The elevator 80 is able to transfer the chips 24 from the interior of the locking container 74 to the interior of the machine 76.

The perspective view of FIG. 5 diagrammatically shows the general structure of a mobile container, such as the transfer container 72. It can be seen that the transfer container 72 firstly comprises a rigid case 82 within which is located a fan 84 similar to the fans 36 equipping the storage cabinet 10. As in the case of the fans 36, it is preferable for a motor 86 operating the fan 84 and a bearing for holding a shaft 88 to be located outside the rigid case 82 and for the shaft 88 to traverse the walls of the rigid case 82 through orifices the diameters of which are larger than the diameter of the shaft 88. The rigid case 82, which has a square or rectangular section, is elongated and, at each of its ends, communicates with a rigid sleeve 92 via a bellows 90a, 90b. At the end opposite to the bellows 90a, 90b of the rigid sleeve 92 there is a flange 94 enabling the tight fixing thereof to a rigid case 96, each flange 94 being placed around an opening 98 located in the rigid case 96. Thus, the rigid case 96 and the rigid sleeves 92 constitute the first rigid case in which the chips 24 are located, whilst the rigid case 82 constitutes the second case housing the fan 84. Thus, the fan 84 permits a permanent circulation of air within the rigid case 82, the air being sucked through the bellows 90a and is discharged through the bellow 90b. In the particular case described here, the general direction of the bellows 90a, 90b and the rigid sleeves 92 is perpendicular to the general direction of the rigid cases 82 and 96, but it would not pass outside the scope of the invention to use another arrangement.

A filter 100 is provided in the case 96 just downstream of the connection with a sleeve 92b, whilst the basket 14 rests at a location situated on the lower wall of the transfer container 72 immediately downstream of the filter 100. Thereagain, the arrangement is such that the plane of the chips 24 is parallel to the air flow direction, so that a laminar air flow sweeps over both faces of each chip 24. As in the case of the storage cabinet 10, the transfer container 72 is equipped with an auxiliary fan 102 positioned so as to blow external air into the transfer container 72. The auxiliary fan 102 is preferably positioned in such a way as to blow in the external air upstream of the filter 100, which is preferably an absolute filter.

FIGS. 4 and 5 also show that the rigid case 96 is in the form of a hollow parallelepiped and that the rigid case 82 is mounted on the rigid case 96 in such a way that the bellows 90b is very close to one of the ends of the rigid case 96 and that the bellows 90a is relatively remote from the other end of the rigid case 96. That part of the rigid case 96 located between the connection point of a sleeve 92a and the end of the rigid case 96 thus constitutes a nose 104, whereof the first end communicates with the interior of the transfer container 72 and the second end communicates with the exterior by an opening 107. The second end can be sealed by a door 106 fixed to the upper edge of opening 107 and being able to pivot about an axis perpendicular to the plane of the drawing and passing in the immediate vicinity of the upper edge of the opening 107.

FIG. 4 also shows that, in the vicinity of the filter 100 in the transfer container 72, there is a passage 108 for a handling rod 110. Preferably, the width of the passage 108 is less than that of the rigid case 96, and its dimensions are just adequate to permit the passage of the handling rod 110. If necessary, it is possible to provide a small opening at the base of the filter 100 for the passage of the handling rod 110. The handling rod 110 is manipulated with the aid of a means which will be described hereinafter relative to FIG. 6. The handling rod 110 has, at one of its ends, an electromagnet 112 which can co-operate with a magnet 114 provided in the lower part of the basket 14. Thus, when the end of the handling rod 110 is introduced beneath the basket 14 and the electromagnet 112 is energized, the basket 14 is maintained on the end of the handling rod 110 and the basket 14 can be raised and displaced in translation. Therefore the basket 14 can be moved from the starting position 14a, which is its normal position in the transfer container 72, to a position 14b diagrammatically represented in mixed line form in the drawing. The length of the handling rod 110 is adequate to enable it to transport the basket 14 from the starting a position 14a up to position 14c within the locking container 74 and above the opening 78.

FIG. 5 shows that the openings such as 98 for the flanges 94 can be provided on any random face of the rigid case 96. If necessary, it is easy to remove the flanges 94 from the openings 98 on which they are fixed and to place them on another face of the rigid case 96. The unused openings 98 are sealed by plates 99. In the same way, with regards to the locking container 74 used for the introduction of the chips 24 into the machine 76, it is not necessarily placed on an upper planar face of the machine 76. It can be positioned to the side thereof in such a way that one vertical wall of the locking container 74 is in the immediate vicinity of a vertical wall of the machine 76. In this case, the opening 78 is positioned on the vertical wall, whilst the wall of the machine 76 has an opening permitting the passage of a gripping means belonging to the machine 76. The locking container 74 is constructed in the same way as the transfer container 72 and will not be described again here.

A description will now be given of an operation of transferring chips 24 from the transfer container 72 to the interior of the machine 76 and vice versa, as well as the transfer of chips 24 from the machine 76 to the storage cabinet 10 with the aid of the transfer container 72. The transfer container 72 can be manipulated by an operator, because it is relatively light and has small overall dimensions. For example, its total length (from the auxiliary fan 102 to the door 106) can be approximately 70 cm, whilst the rigid case 96 has a square or rectangular section the dimensions of which are smaller than those of the racks 12 of the storage cabinet 10. As a result of this arrangement, the nose 104 penetrates not only the interior of the storage cabinet 10 after the opening of one of the doors 68, but also the interior of the corresponding rack 12. However, for the reasons indicated at the beginning of the description and in particular because human beings generate dust, it is preferable for the transfer container 72 to be transported from the storage cabinet 10 to the container 74 by a robot 116.

Figure 6:
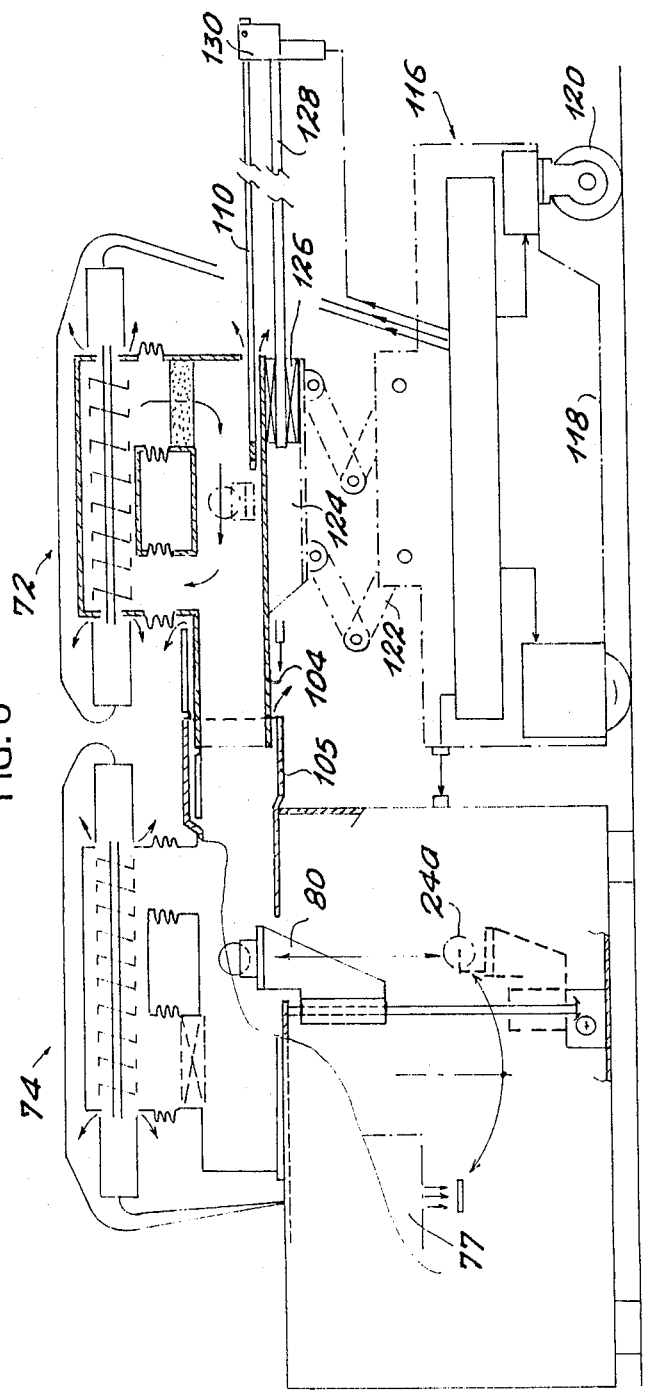
FIG. 6 is a diagrammatic profile and part sectional view illustrating the transfer of chips between a mobile transfer container and a machine according to a first embodiment of the invention.

The robot 116 is diagrammatically shown in FIG. 6, where it is possible to see that it essentially comprises a carriage 118 resting on the ground by means of wheels 120. In the upper part of the carriage 118 are mounted articulated arms 122, on which rests a support 124. The transfer container 72 rests on the support 124, whilst the articulated arms 122 are mobile between a low position and a high position, so that the transfer container 72 can be brought to the desired height. On the support 124 is mounted an electromagnet 126, which makes it possible to act on a rod 128. The movements of the rod 128 are transmitted to the handling rod 110 via a connecting device 130.

If the transfer container 72 is transported by a human operator, it must be connected by connecting wires to a carriage containing all the control instruments and in particular the electric power supply for the fan motors 86. In the case where transfer is performed with the aid of the robot 116, the robot 116 has all the controls and, in particular, the electric power supply for the fans 86.

A basket of chips 24 is transferred between the transfer container 72 and the machine 76 in the following way. During the transfer between the storage cabinet 10 and the machine 76, the basket 14 occupies the position 14a illustrated in FIG. 4, whilst the door 106 of the transfer container 72 is closed (i.e., it is in the vertical position). The transfer container 72 rests on the support 124 of the robot 116. When the robot 116 approaches the machine 76, the position of the articulated arms 122 is regulated in such a way that the nose 104 of the transfer container 72 is at the same height as a nose 105 of the locking container 74. At that instant, a door 109 of the container 74 is opened. The door 109 is mounted in the same way as the door 106 of the transfer container 72. The door 109 can be opened in the following way. On the outer part of the door the door 109 is provided a curved arm 132, which passes into the air gap of an electromagnet 134 which is fixed with respect to the locking container 74. When the door 109 is in the closed or vertical position, only the end of the curved arm 132 is located in the air gap of the electromagnet 134. On energizing the electromagnet 134, the curved arm 132 is attracted and lifts, which has the effect of progressively opening the door 109. The door 106 of the transfer container 72 can be opened through two series of magnets mounted in the nose 105 of the locking container 74. Such a series of magnets is similar to that which can be used in the system for the opening of the doors 68 of the storage cabinet 10 and will be described hereinafter relative to FIGS. 7 and 8.

When the transfer container 72 is at the correct height and the door 109 of the locking container 74 is open, the door 106 of the transfer container 72 is opened and the robot 116 is moved in such a way that nose 104 of the transfer container 72 slightly penetrates the interior of the nose 105 of the locking container 74. As the two containers 72, 74 are under an overpressure with respect to the outside, the air present in the two containers 72, 74, which is very clean, can escape to the outside through the spaces between the noses 104, 105 of the two containers 72, 74. The electromagnet 126 of the support 124 (FIG. 6) is energized, so that the rods 128 and 110, which up to then had been in the retracted position (i.e., substantially in the position illustrated in FIGS. 4 and 6), advance towards the left with respect to FIGS. 4 and 6 until the electromagnet 112 of the handling rod 110 is located below the magnet 114 of the basket 14. The slot 22 provided in the lower part of the basket 14 (FIG. 3) permits the passage of the end of the handling rod 110. When the magnets 112, 114 are in contact with one another, the electromagnet 112 is energized, so that the basket 14 is kept maintained at the end of the handling rod 110. The handling rod 110 is slightly raised (e.g., via the connecting device 130) and is moved to the left in respect to FIG. 4 until the basket 14 occupies the position 14c within the locking container 74, above the opening 78. The elevator 80 of the machine 76 is then brought into the raised position (i.e., position illustrated in FIG. 4), and the handling rod 110 is lowered so that the basket 14 rests on the elevator 80. The electromagnet 112 is deenergized, and the handling rod 110 is retracted. The elevator 80 is moved downwards within the machine 76 (FIG. 6) until the chips 24 are in a position 24a diagrammatically shown in mixed line form. They can then be transported to a working station 77.

When the processing or treatment within the machine 76 is ended and it is necessary to bring the chips 24 into the storage cabinet 10, the following procedure is adopted. Within the machine 76, the chips 24 are transported from the working position 77 to the position 24a, and the elevator 80 brings them into the locking container 74. The handling rod 110 is displaced until its end passes beneath the basket 14, the electromagnet 112 is energized, and the handling rod 110 slightly is raised. The electromagnet 126 is then energized, so that the rods 128 and 110 are moved to the right with reference to FIGS. 4 and 6, until the basket 14 returns to its position 14a within the transfer container 72.

In order to better maintain the basket 14 within the transfer container 72 during the transfer, magnets 136 (see FIG. 4) are provided on the feet of the basket 14, which co-operate with magnets 138 provided in the lower wall of the transfer container 72.

Figure 7:
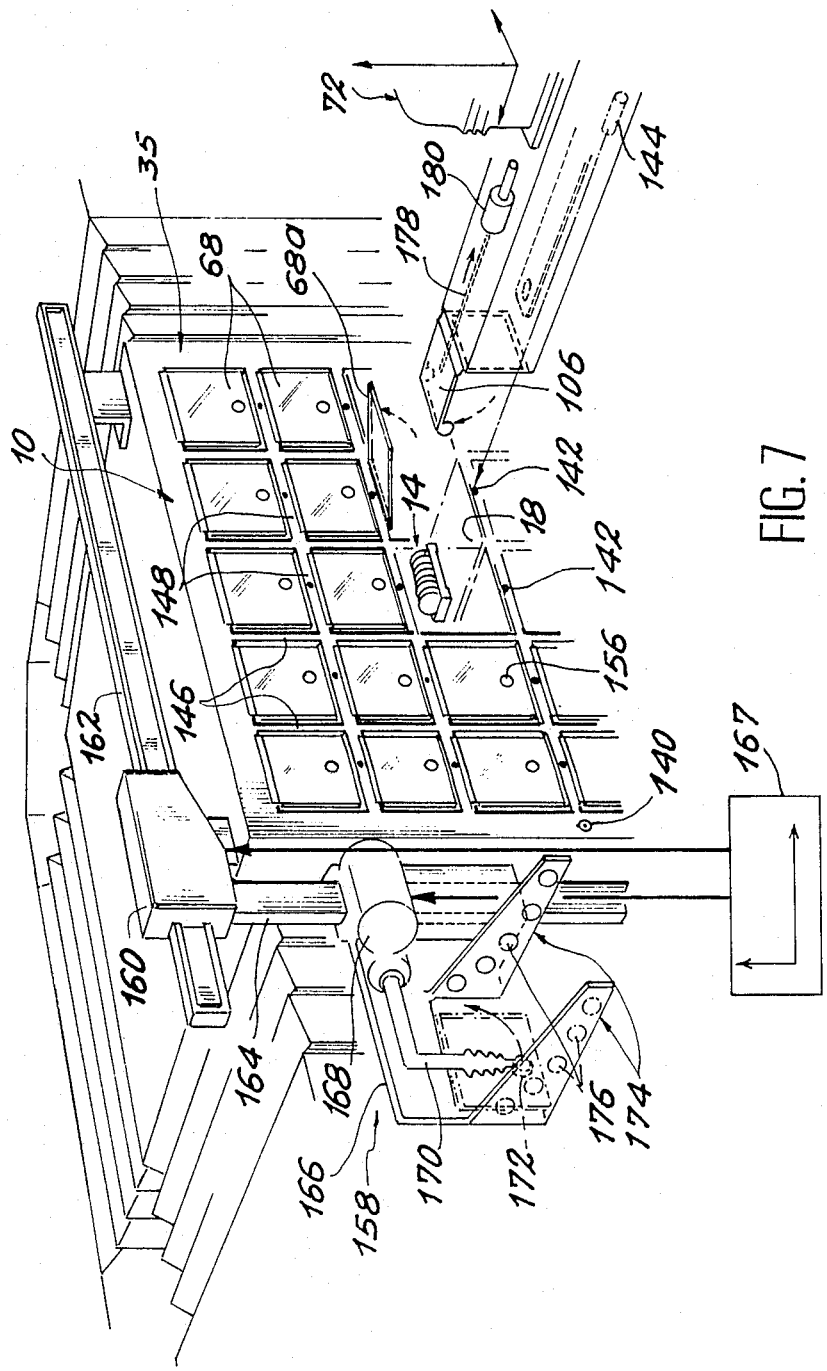
FIG. 7 is a diagrammatic perspective view showing the front panel of the cabinet of FIG. 1 during the operations of introducing or extracting chips with respect to the cabinet.

The handling rod 110 can then be brought into its starting position, illustrated in FIG. 4, in which its end is no longer beneath the basket 14. The robot 116 is then moved, so that the nose 104 of the transfer container 72 passes out of the nose 105 of the locking container 74. The electromagnet 134 is deenergized, so that the door 109 of the locking container 74 closes again, and the door 106 of the transfer container 72 is also closed. The robot 116 is then moved and brought in front of the storage cabinet 10, so that the transfer container 72 is located in a position such that the rigid case 96 has its greatest length perpendicular to the plane of the front panel 35 of the storage cabinet 10 (FIG. 7).

The placing of the robot 116 in front of the chosen door 68 takes place with the aid of an origin targeting sensor 140 located on one side of the front panel 35. As a result of a detector 144, the robot 116 is centred on the sensor 140 (which can, e.g., be an infrared sensor, a proximity detector, or any other equivalent device). The robot 116 performs its own resetting, and then its data processing system leads it from the precise position to the chosen door 68 (e.g., the door 68a in FIG. 7). A second sensor 142, which is a fine targeting sensor, permits the robot 116 to be perfectly centred and positioned in front of the chosen door 68 through the detector 144. The number of sensors 142 corresponds to the number of doors 68 on the front panel 35 of the storage cabinet 10. The sensors 142 can be placed either on the actual door, or on another element of the front panel 35 at any random location thereof, the data processing system of the robot 116 being programmed as a function thereof.

The front panel 35 of the storage cabinet 10 can be constituted by a group of vertical 146 and horizontal 148 posts or bars, thus defining openings having a square or rectangular section the dimensions of which correspond to those of the racks 12. The doors 68 are square or rectangular panels the dimensions of which are similar to those of the thus defined openings. In the preferred embodiment, each door 68 is fixed by its upper edge to one of the horizontal bars 148 and can pivot about a horizontal axis parallel to the bar. In order to prevent the friction which would occur with conventional hinges and which would lead to particles and therefore dust being generated, the doors 68 are mounted on the front panel 35 of the storage cabinet 10 with the aid of thin deformable sheets 150 (FIG. 8). The length of the thin deformable sheets is substantially that of the upper edge of the doors 68 and each thin deformable sheet is fixed on the one hand to the horizontal bar 148 located above the door 68 and on the other hand to the upper part of the door 68. Thus, the pivoting movement of the door 68 causes no friction and merely deforms the thin sheet 150.

Moreover, the dimensions of the doors 68 are not precisely those of the openings defined by the posts 146 and 148, but are slightly smaller, so as to leave a passage about 1 mm wide for the air contained within the storage cabinet 10 to escape to the outside when the storage cabinet 10 is maintained under an overpressure with respect to the room. A door, like door 68a illustrated in FIGS. 7 and 8, is consequently mobile between a closed position 68a1 in which it is substantially vertical and an opening position 68a2 in which it is substantially horizontal following pivoting, during which the thin sheet 150 has been deformed. In order to maintain each door 68 in the closed position and so as to in particular ensure that it does not open excessively under the effect of the overpressure prevailing within the storage cabinet 10, a system of magnets is provided. This system comprises a first magnet 152 in the lower part of the door 68 and preferably in the centre of the lower edge thereof and a second magnet 154, fixed with respect to the front panel 35 and which can be placed on the horizontal post 148 corresponding to the lower edge of the door 68 and in the centre thereof, so as to face the first magnet 152. The doors 68 are opened by means of knobs if opening takes place by a human operator, or by using third magnets 156 when a robot 158 is used and as will be described hereinafter.

An example of such a robot 158 is illustrated in FIGS. 7 and 8. The robot 158 firstly comprises a carriage 160 which moves along a horizontal rail 162 fixed to the upper part of the storage cabinet 10. On the carriage 160 is mounted a vertical rail 164 along which can move a mobile support 166. The dimensions and respective position of the different elements constituting the robot 158 are such that, during the displacement of the carriage 160 along the horizontal rail 162, the vertical rail 164, the mobile support 166, and all the elements mounted on the mobile support 166 remain in front of the front panel 35 of the storage cabinet 10. A motor 168 controlling a mobile arm 170 is fixed to the mobile support 166. The mobile arm 170 has a first horizontal portion rotatable about its axis and a second portion perpendicular to the first. The second portion of the mobile arm 170 carries at its end a fourth magnet 172 able to co-operate with the third magnets 156. The movements of the carriage 160 on the horizontal rail 162 and the mobile support 166 on the vertical rail 164 are regulated by a control device 167, which can itself be optionally controlled by the robot 116.

When the robot 116 of FIG. 6 has brought the transfer container 72 in front of the chosen door 68a, the carriage 160 is moved along the horizontal rail 162, and the mobile support 166 is moved vertically along the vertical rail 164 until the fourth magnet 172 faces the one of the third magnets 156 associates with the chosen door 68a. The fourth magnet 172 can be an electromagnet, which is energized at the desired moment by the control device of the robot 158. The starting up of the motor 168 leads to the rotation of the mobile arm 170 about a horizontal axis and therefore to the opening of the chosen door 68a. On the mobile support 166 there are also two arms 174 constituted by planar plates perpendicular to the front panel 35 of the storage cabinet 10. The distance between the arms 174 slightly exceeds the width of a door 68. On each of the arms 174 is mounted a series of fifth magnets 176 used for the opening of the door 106 of the transfer container 72, as will be described hereinafter.

When the robot 116 has brought the transfer container 72 in front of the chosen door 68a, but at a certain distance from the latter, the robot 158 is moved until the arms 174 surround the chosen door 68a. The motor 168 is started up, so that the mobile arm 170 opens the chosen door 68a. The robot 116 is then advanced until the door 106 of the transfer container 72 comes into the vicinity of the end of the arms 174 opposite to the front panel 35. The door 106 of the transfer container 72 is pivotably mounted about its upper edge by means of a thin sheet, in the same way as the doors of the storage cabinet 10. On reaching the position illustrated in FIG. 8, the lower part of the door 106 is attracted by the fifth magnet 176a located at the end of the arm 174 opposite to the storage cabinet 10. The door 106 then pivots in a clockwise direction with respect to FIG. 8 and consequently slightly opens. As the robot 116 advances the transfer container 72, the door 106 progressively opens, attracted by the other fifth magnets 176. It is pointed out that the line constituted by the fifth magnets 176 is inclined with respect to the horizontal and progressively rises from the end fifth magnet 176a. However, so as to ensure that the door 106 does not return to its closed position (e.g., due to the attraction of the fifth magnets 176 which it has already cleared) there is a maintaining device constituted by a flexible metal tape 178, whereof one end is fixed to the outer face of the door 106. An electromagnet 180 acts on the flexible metal tape 178 so as to keep it constantly under tension during the opening of the door 106, which prevents the latter from dropping. The door 106 thus passes through a certain number of intermediate positions 106a up to the open position 106b, where it is substantially horizontal. With the robot 116 continuing to move, the nose 104 of the transfer container 72 penetrates the interior of the storage cabinet 10. Thus, the dimensions of the nose 104 are such that the nose 104 of the transfer container 72 can not only penetrate the storage cabinet 10, but can optionally penetrate the racks 12 in which are stored the baskets 14 of chips 24.

Thus, when the transfer container 72 is in position, the handling rod 110 is moved so as to transfer the basket 14 from the interior of the transfer container 72 to the bottom of the chosen rack 12. This operation is performed in the same way as the transfer of the baskets 14 between the transfer container 72 and the elevator 80 of the machine 76 (FIG. 4) and will not be described in detail here. When the basket 14 is placed in its rack 12 the handling rod 110 is retracted, the robot 116 moves back, and the door 106 of the transfer container 72 is closed again by progressively deenergizing electromagnet 180 in order to progressively relax the flexible metal tape 178. The mobile arm 170 of the robot 158 is rotated so as to progressively close the chosen door 68a again, and fourth magnet 172 is deenergized. The robot 158 can then be brought into another position (e.g., in front of another door or a rest or wait position).

The operation of seeking a basket 14 within the storage cabinet 10 for transferring it elsewhere takes place in the following way. The robot 116 is brought in front of the chosen door 68a, as well as the robot 158. The chosen door 68a is opened in the manner described hereinbefore, and the operations of approaching the transfer container 72 and opening the door 106 thereof also take place in the same way. The handling rod 110 is then advanced until it passes beneath the basket 14, raises the same, and brings it to its location within the transfer container 72, as in the case where the basket 14 is extracted from the machine 76. The robot 116 is moved back, and the chosen door 68a, as well as the door 106 of the transfer container 72 is closed.

FIG. 9 illustrates another possible arrangement for the storage cabinet racks 12. In the case of FIGS. 1 and 2, the racks are bounded by vertical partitions 16 and horizontal floors 18 the dimensions of which are such that the front space 34 of the storage cabinet 10 is entirely free. However, it would not pass outside the scope of the invention to use receptacles 182 (FIG. 9) in the form of rectangular parallelepipeds open at each of their two ends and the length of which is equal to the distance between the downstream face of the filter 28 and the front panel 35 of the storage cabinet 10. Obviously, in the area of the receptacles 182 positioned close to doors 68, there are openings 184 on either side, so as to permit the passage of air in the front space 34. In this case, the baskets 14 are placed in slides 186 the sections of which are similar to those of the receptacles 182. However, the slides 186 are smaller than the receptacles 182, so that the slides 186 can penetrate the receptacles 182. The slides 186 have the same length as the receptacles 182 and are also provided with openings 188 in the vicinity of the associated one of the doors 68, so as to permit the passage of air. Each slide 186 can be equipped with a knob or a sixth magnet 190 located outside the storage cabinet 10 and in the vicinity of the lower edge of the associated door 68. This arrangement makes it possible to move the slides 186 towards the outside of the storage cabinet 10 as a result of the knob or the sixth magnet 190, so that the basket 14 is moved towards the transfer container 72.

THE SECOND EMBODIMENT

FIGS. 10 to 17 relate to a second embodiment of the fixed and mobile containers according to the invention.

Figure 10:
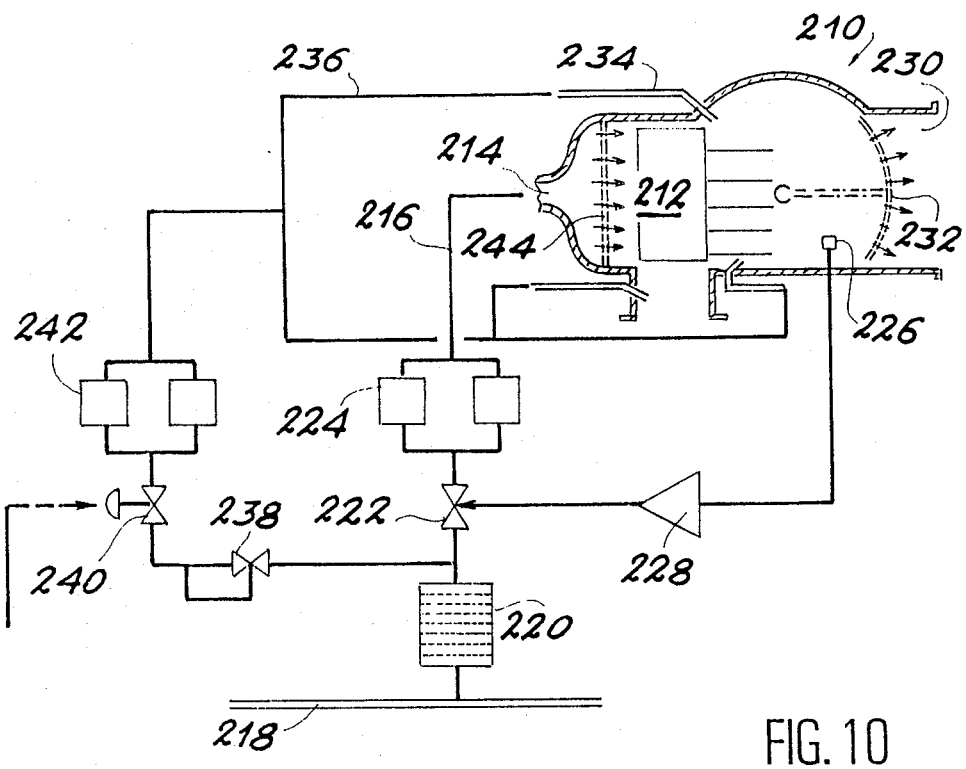
FIG. 10 is a diagrammatic view showing a container according to a second embodiment of the invention, as well as the connections between the latter and the ultraclean gas source.

On referring to FIG. 10, it can be seen that the container according to the second embodiment and carrying the general reference 210 is internally provided with a location for the object or objects to be treated or processed. As will be described hereinafter, those objects can be silicon chips placed on a support 212.

According to this second embodiment, the means for producing the overpressure and for circulating the gas within the installation are constituted by an external ultraclean, pressurized gas source.

The container 210 has an intake 214 enabling it, via a pipe 216, to be linked with a duct 218, which is itself connected to the not shown ultraclean gas source. The latter can be of any known type and can in particular be a source supplying a pressurized ultraclean gas. In the embodiment illustrated here, the pipe 216 has, passing from the duct 218 to the container 210, firstly an active carbon filter 220, then a pressure regulator 222, and finally a set of high pressure filters 224. It should be noted that the presence of the active carbon filter 220 and the filters 224 is not indispensable, their use being dependent on the cleanness of the air supplied by the source. Moreover, those elements could optionally be incorporated into the system by which of the ultraclean pressurized air is obtained. The essential point is that the gas entering the container 210 through the intake 214 has the desired cleanness for the envisaged use. The pressure regulator 222 is linked with a pressure sensor 226, positioned within the container 210, via a servocontrol device 228. It is therefore possible to act on the gas flow circulating within the pipe 216 in order to maintain a constant pressure within the container 210.

With respect to the storage cabinet, the linking thereof with the external ultraclean gas source can take place by eliminating the auxiliary fan 50 (FIG. 1) and by replacing it by a coupling with the duct 218 connected to the gas source.

FIG. 10 also shows that, on the side opposite to the intake 214, the container 210 has an outlet 230 for the air which passes through the container 210, whilst sweeping the objects to be treated. In the position illustrated in FIG. 10, the outlet 230 is closed by a door 232 in the form of a panel having a certain number of small openings. As will be shown hereinafter, this arrangement ensures that the gas passing through the openings has a high speed, which prevents the deposition of particles at the openings and prevents the particles in the room from entering the container.

Figure 11:
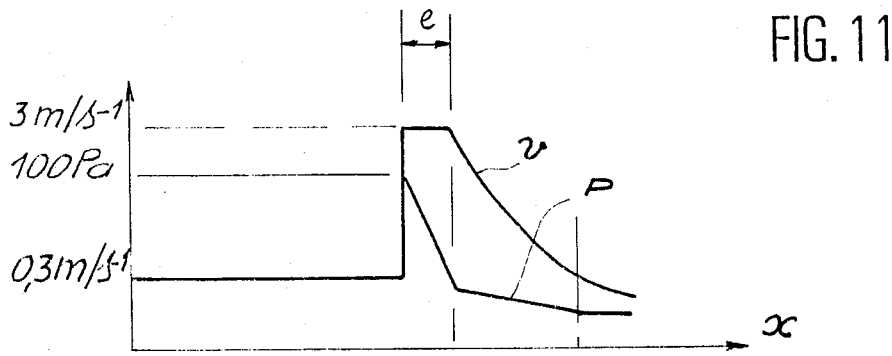
FIG. 11 is a graph showing the variations of the pressure and the speed of the gas circulating within the container of FIG. 10.

This arrangement makes it possible to obtain an "air wall" over a length e, as illustrated in FIG. 11. The latter is a graph which gives, as a function of the location x within the container 210 and outside the same, the variations of the pressure P (expressed in pascals) and the speed v (expressed in meters per second). For example, the container 210 can be 300 mm long, 120 mm wide, and 160 mm high with an air leakage rate of approximately 20% of the front flow. The air leakage rate is the proportion of the air flow which does not pass out of the container 210 through the door 232, but passes into the other interstices of the container 210 (i.e., the space between the door 232 and the walls of the container 210 leaks at the elements passing through the walls of the container 210, etc.). The flow of gas sweeping over such a container 210 can be approximately 25 m$^3$/hour. FIG. 11 shows within the container 210 a speed v of, e.g., 0.3 mps. At the door 232 the speed suddenly increases to reach a value of, e.g., 3 mps over distance e. Subsequently, the speed progressively drops outside the container 210 to re-assume its initial value and, optionally, to be cancelled out at a considerable distance therefrom. The overpressure is, e.g., 100 Pa within the container 210. Then, starting from the door 232, it drops to reach values which are much lower than this. In FIG. 11, it should be noted that the value P represents the pressure difference between the interior of the container 210 and the room and not the absolute pressure of the gas. The pressure drop between the interior and the exterior of the container 210 is approximately 50 to 800 Pa.

On referring once again to FIG. 10, it is possible to see the system making it possible to clean the interior of the container 210 by pressurized ultraclean gas jets oriented in given directions. It can be seen that this system comprises a certain number of nozzles 234 connected by pipes such as 236 to the duct 218, which links the device with the ultraclean gas source. When it is wished to carry out this cleaning operation, the pressure regulator 222 is closed, and the gas from the duct 218 firstly passes into the active carbon filter 220, then into a pressure regulator 238, a remotely controlled stop valve 240, and finally a set of absolute filters 242. When there are no objects to be treated within the container 210, this arrangement makes it possible to clean the interior of the container 210 by blowing ultraclean air at clearly defined points. The number and arrangement of the nozzles 234 are dependent on the locations where such cleaning is necessary. Obviously, the expert could vary the number and arrangement of the elements located between the duct 218 and the nozzles 234 as a function of the particular case.

Finally, FIG. 10 shows that it is possible to provide between the intake 214 and the support 212 on which are placed the objects to be treated, a grid or grating 244 serving as an air diffuser, in order to obtain a laminar jet level with the object to be treated or processed. As can be seen hereinafter, the grid 244 can be rendered live and used as an ionizer.

Figure 12:
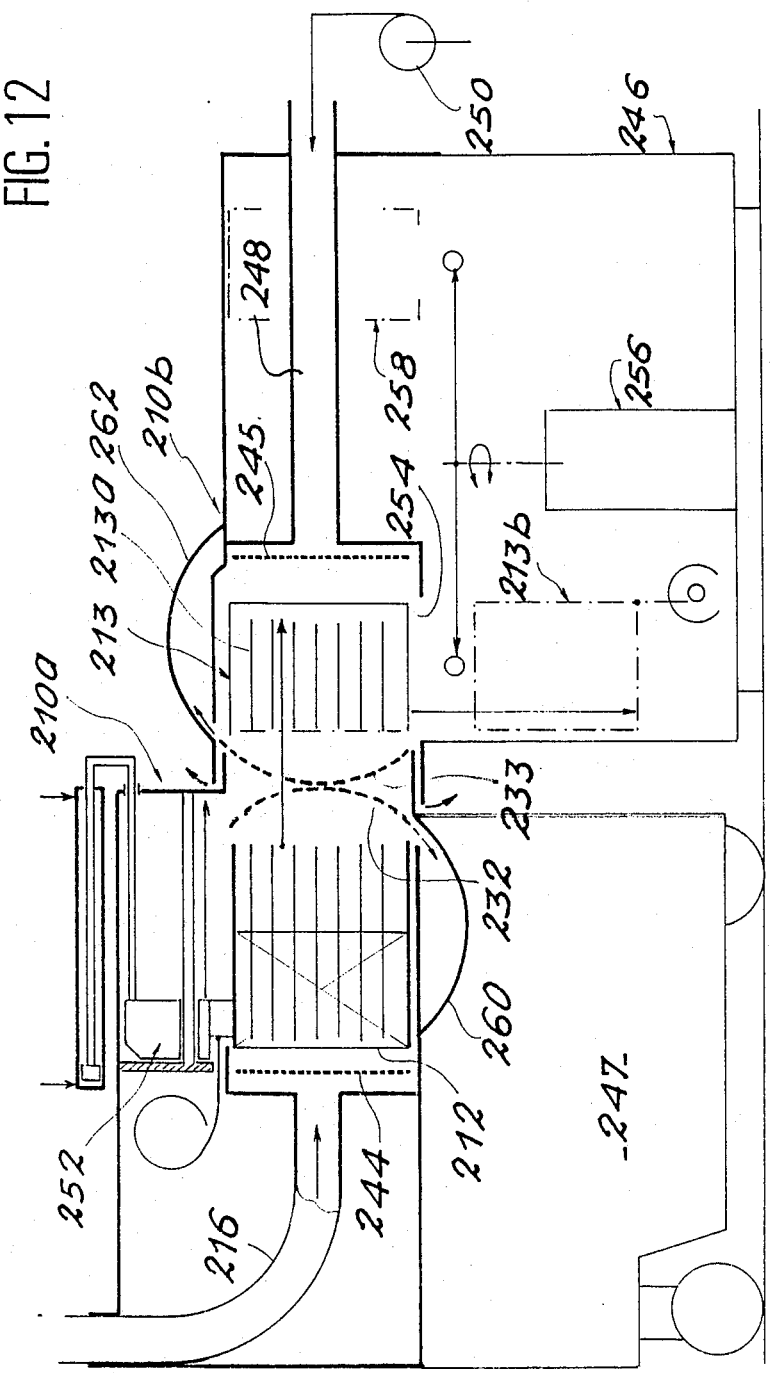
FIG. 12 is a diagrammatic view in elevation showing the coupling of two containers according to the second embodiment of the invention, whereof one is displaceable within the room and whereof the other serves as a lock for the transfer of silicon chips within a processing machine.

FIG. 12 shows how it is possible to couple two containers according to the invention so as to bring about the transfer of silicon chips within a processing machine.

FIG. 12 shows a first container 210a mounted on a carriage 247, which permits the transfer of silicon chips between a not shown storage cabinet and a processing machine 246. A second container 210b, of the same type as the container 210a, is mounted on the processing machine 246. The container 210b can form an integral part of the processing machine 246 or it may simply be placed thereon.

FIG. 12 shows the pipe 216 connecting the first container 210a to the pressurized gas source, as well as a pipe 248 connecting the second container 210b to the same source or to another source (e.g., via a pump 250). The support 212 within the first container 210a is mobile within the latter by means of a gripping and lifting device 252 the operation of which will be described in greater detail hereinafter relative to FIG. 13. The displacement of the support 212 makes it possible to transfer the silicon chips on a support 213 located within the second container 210b. The support 213 is provided on its lower part with an opening 254 linking it with the interior of the processing machine 246. The support 213 can be moved between a position 213a, shown in continuous line form and in which it is within the second container 210b, and a position 213b, shown diagrammatically in mixed line form and in which it is located within the processing machine 246. A device 256 within the processing machine 246 makes it possible to transport the silicon chips within the processing machine 246 between the position 213b of the support 213 and a working station 258. Finally, each of the containers 210a and 210b has recesses 260, 262, where are respectively positioned doors 232 and 233, when they are in the open position. FIG. 12 again shows the grid 244 equipping the first container 210a and, if necessary, a similar grid 245 equipping the second container 210b.

A more detailed description will now be given of the containers 210a and 210b, as well as the procedure for coupling these two containers and the transfer of silicon chips from one to the other with respect to FIGS. 13 and 15.

It is possible to see the first container 210a connected to the ultraclean gas source by the pipe 216 and equipped with the grid 244 located between the intake 214 and the support 212. The support 212 has a pile of tracks or paths 263 on each of which is located a silicon chip 264. Each of the silicon chips 264 is kept on the corresponding path 263 by an air cushion. The air is blown into the interior of each of the paths 263 and leaves the same by openings located in the upper face of each path 263. Part of each of the paths 263 is located within a box 266 (on the left-hand side in connection with FIG. 13), whilst another part is outside the box 266.

A cover 268 placed above the first container 210a encloses the gripping and lifting device 252, which essentially comprises an electromagnet 270 connected to the support 212 by a rigid connecting element 272. The electromagnet 270 makes it possible to raise and set down, as required, the support 212 within the first container 210a. A horizontal rod 274 serves as a guide for displacement in horizontal translation of the gripping and lifting device 252. A piston 276, mobile within a cover 278 positioned above the cover 268, is connected by a rod 280 to an element 282 which is connected by a tube 284 to the electromagnet 270. As all the elements 276, 280, 282, 284, and 270 are rigid, the displacement of the piston 276 by not shown motor means leads to the displacement in the same direction of the electromagnet 272. Wires or leads 286 pass along the tube 284 making it possible to supply to the paths 263 of the support 212 the necessary electric power and pressurized gas for the operation of the latter.

Figure 13:
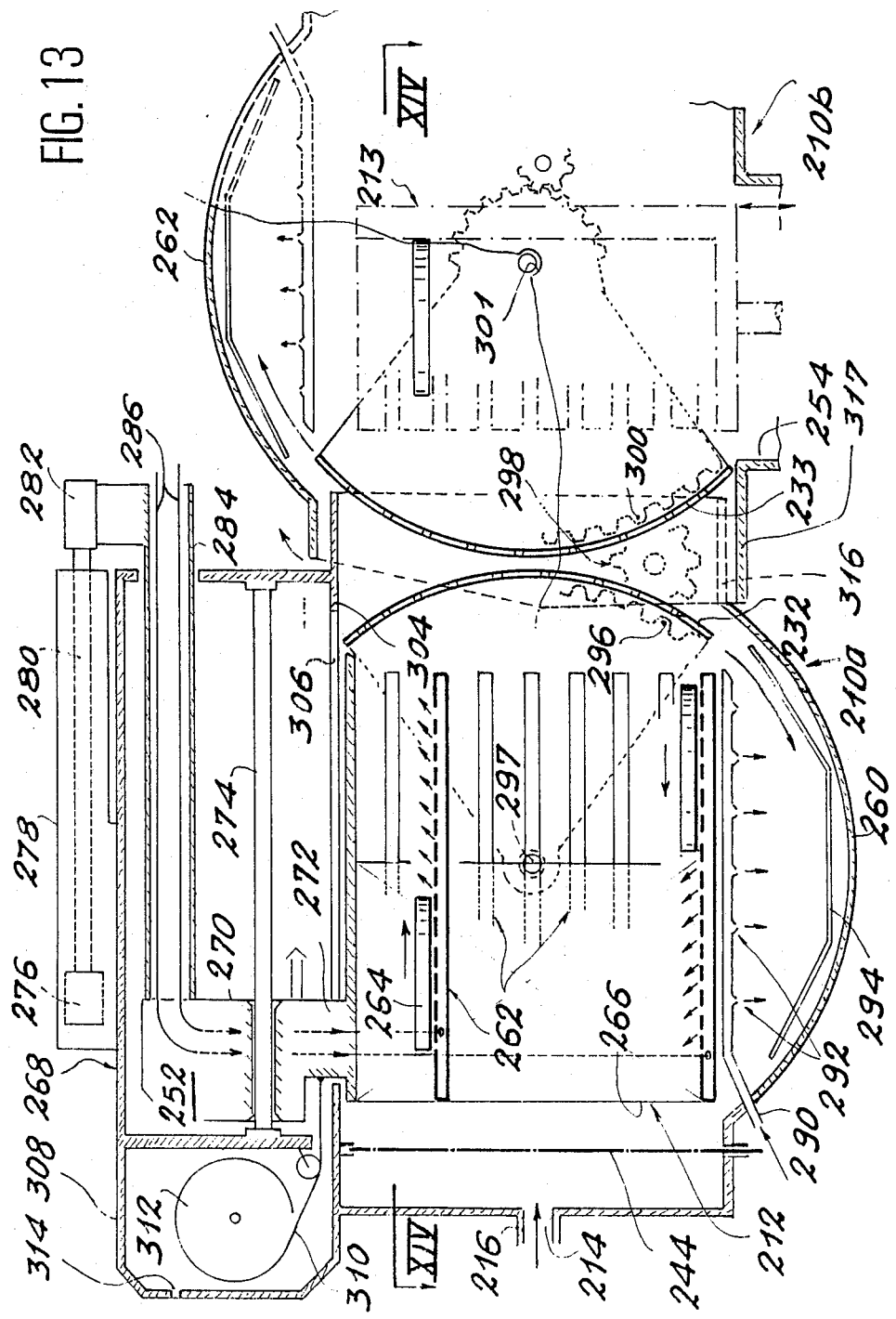
FIG. 13 is a diagrammatic sectional view on a larger scale showing the two containers of FIG. 12 in the coupled position.

FIG. 13 also shows that the cover 268 is separated from the remainder of the first container by a wall 304 having a gap 306 substantially parallel to the horizontal rod 274. The rigid connecting element 272 circulates within the gap 302 when the electromagnet 270 moves from left to right and vice versa with respect to FIG. 13. Within a cover 308 and communicating with the cover 268, the device also has a masking tape 310 mounted on a reel 312. Thus, one of the ends of the masking tape 310 is fixed to the reel 312, whilst its other end is fixed either to the electromagnet 270 or to the rigid connecting element 272. When the gripping and lifting device 252 moves from right to left with respect to FIG. 13, this has the effect of bringing the first container 210a and the cover 268 into communication via the gap 306. However, as one end of the masking tape 310 is fixed to the device, the masking tape 310 covers the gap 306 during that movement, thus limiting any passage of dust from the covers 268 or 308 to the first container 210a. As the cover 308 has an orifice 314 linking it with the outside of the first container 210a (i.e., with the room in which the first container 210a, is located), the air penetrating the first container 210a passes through the orifice 314 into the cover 268 through the gap 306 and then into the cover 308 and from there into the room through the orifice 314.

FIG. 13 also shows that each of the containers 210a and 210b has a recess 260, 262 respectively, in which are located doors 232 and 233, when they are in the open position (FIG. 13 showing the doors in the closed position). A tube 290 having openings 292 is provided within the recess 260 and is linked with the ultraclean gas source. Thus, even when the door 232 is in the open position, the tube 290 makes it possible to blow pressurized ultraclean air into the recess 260, and the orifices of the panels constituting the doors 232, 233 are traversed by a high speed ultraclean gas. Thus, the doors 232, 233 are permanently kept in a highly clean state and, even when the doors are in the open position, it is possible to prevent the deposition of particles thereon.

The doors 232, 233 can, e.g., be constituted by a very fine woven cloth with a transparency between 0.1 and 0.2 which is supported by a rigid frame. This cloth (the thickness of which is approximately 150 to 200 micrometers) can be in any random form can, e.g., be in the shape of a portion of a cylinder or a portion of a sphere. The doors 232, 233 can be made in one or two parts, and the material constituting the cloths can be a metal (woven or fritted) or a plastic (PVDF or polysulphone).

As has been shown hereinbefore, on passing through the door 232, the spread of the air is multiplied by 5 to 10 and therefore any pollution is kept away from the outer face of the panel. The recess 262 for the door 233 of the second container 210b, is identical to the recess 260 for the door 232 of the first container 210a and will consequently not be described in detail here.

FIG. 13 also shows within the recess 260 an electrode 294 placed between the wall of the recess 260 and the door 232, when the latter is in the open position. The electrode 294 can be raised to a given electric potential in order to attract the particles which might accidentally be deposited on the door 232, and it thereby maintains the door 232 in a very high cleaness state.

Figure 14:
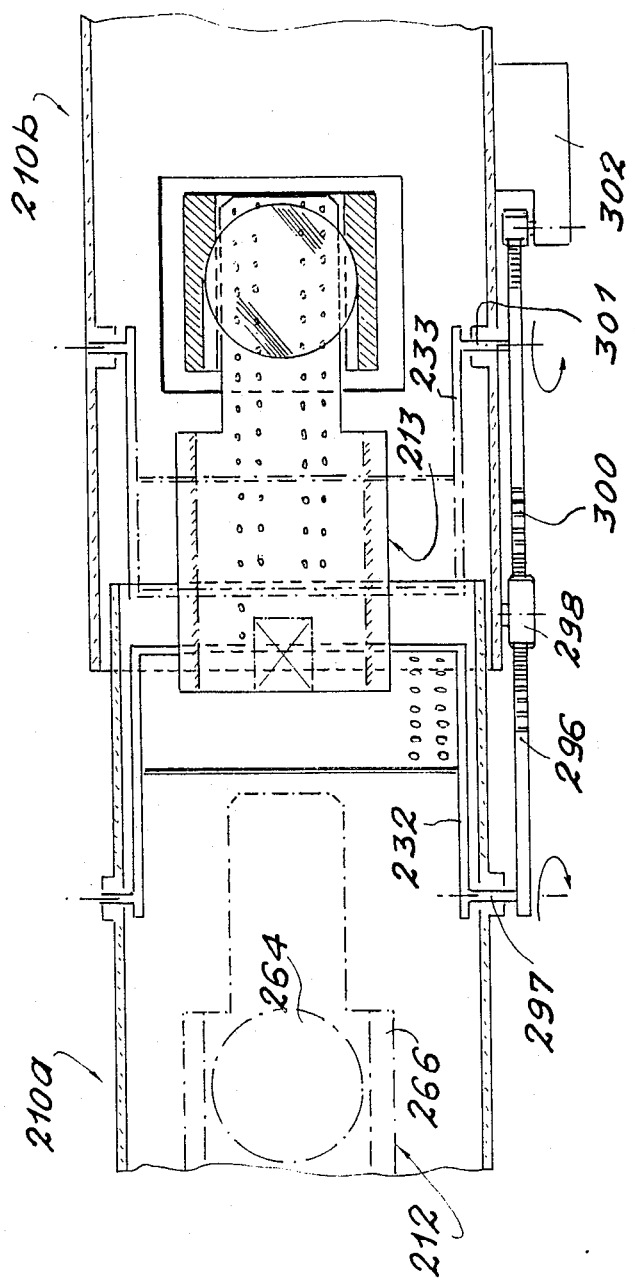
FIG. 14 is a diagrammatic sectional view along line XIV—XIV of FIG. 13, but illustrating a situation in which the doors of the containers are in the open position.

FIGS. 13 and 14 also show that the door 232 of the first container 210a is integral with a toothed wheel 296 via a spindle 297. The toothed wheel 296 meshes with a pinion 298, which in turn meshes with a toothed wheel 300 integral with the door 233 of the second container 210b via a spindle 301. The toothed wheels 296 and 300, the pinion 298, and a motor 302 are located outside the containers 210a, 210b, making it possible to pivot the toothed wheel 300 and consequently, the pinion 298 and the toothed wheel 296. The spindles 297, 301 tightly traverse the walls of the container 210a, 210b (e.g., by means of a dynamic sealing arrangement or any other known system traversing the walls of the containers 210a, 210b). Thus, the motor 302 controls the simultaneous opening of the doors 232, 233. It is pointed out that, in the embodiment shown here, the recess 260 is located on the lower part of the first container 210a, whilst the recess 262 is located in the upper part of the second container 210b. The movements of the two doors 232, 233 consequently take place in reverse directions on simultaneously opening them or on simultaneously closing them, but it would not fall outside the scope of the invention to use other arrangements.

An operation of transferring silicon chips between the first container 210a and the second container 210b takes place in the following way. Initially, the first container 210a placed on the carriage 247 is remote from the processing machine 246 and, consequently, from the second container 210b. The doors of the two containers are in the closed position, and the support 212 within the first container 210a is in the position illustrated in FIG. 13, i.e., on the left-hand side in that drawing. The chips which were initially located in a not shown storage cabinet have been deposited on the tracks or paths 263 of the support 212. The carriage 247 and the processing machine 246 are moved together until a nose 316 of the first container 210a penetrates nose 317 of the second container 210b.

In the present description, the term "nose" of the container refers to a substantially cylindrical portion thereof positioned downstream of the door with respect to the gas flow direction within the container when the door is in the closed position. In the embodiment illustrated in FIG. 13, the section of the nose 316 of the first container 210a is slightly smaller than the section of the nose 317 of the second conatnier 210b. Thus, during coupling, the nose 316 of the first container 210a is located within the nose 317 of the second containter. 210b, a space being provided between the outer face of the nose 316 and the inner face of the nose 317.

The two containers are kept for a few instants in this position (i.e. with the doors closed), in order to clean and purge the space between the two doors. This is brought about with the aid of pressurized air introduced into each of the containers. This air traverses the doors, is located in the space between the latter, and is discharged through the gap located between the nose 316 and the nose 317. When this space is sufficiently clean (i.e., a cleanness equal to that prevailing within the containers) the motor 302 is actuated, which leads to the opening of the doors via the toothed wheel 300, the pinion 298, and the toothed wheel 296. Thus, each door is brought into its recess 260 or 262.

The electromagnet 270 is then excited, so that it raises the support 212 and the gripping and lifting device 252 is moved from left to right in FIG. 13. During this movement, the masking tape 310 progressively covers the gap 306. This movement continues until that portion of paths 263 located outside the box 266 is positioned within the support 213. The compressed gas jet used for supporting the silicon chips 264 is oriented in such a way that the chips are moved from left to right in FIG. 13. The dimensions and shape of the support 213 are such that, during this movement, the silicon chips 264 come above spokes provided on the support 213 after leaving the paths 263 of the support 212 and are placed on these spokes when they are no longer maintained in the raised supported position by the compressed air. When all the silicon chips 264 have been transferred in this way, the support 213 can be manipulated within the processing machine 246 and the chips are brought to the working station.

During the operation to be performed on the silicon chips 264, the first container 210a can remain in the coupling position or it can be separated from the second container 210b (e.g., to perform another transfer). It is obvious that, prior to carrying out this separation, it is necessary to bring the support 212 to its starting position and to close the doors of the two containers. The procedure is the same as that which will now be described when it is a question of bringing the silicon chips 264 from the processing machine 246 to the first container 210a.

Prior to performing this transfer in the reverse direction, the two containers are brought into the coupling position, as illustrated in FIG. 13 and the space between the two doors is, purged before opening the latter.

The device 256 (FIG. 12) is then actuated in order to bring the silicon chips 264 into the position 213b of the support 213, and then an elevator brings the support 213 into the position 213a. The gripping and lifting device 252 is started up so as to bring the support 212 to the working positon (i.e., a position where the righthand end of the paths 263 with respect to FIG. 13 is located within the support 213). Compressed air is then blown through the upper wall of each of the paths, so that the silicon chips 264 are raised above the spokes of the support 213 and displaced from right to left to return to their initial position on the paths 263 of the support 212. The gripping and lifting device 252 is then moved from right to left until the support 212 returns to its starting position. The doors 232, 233 are then closed, and the carriage 247 can be moved away from the processing machine 246.

THE THIRD EMBODIMENT

FIGS. 15 to 17 illustrate another embodiment of a container according to the invention in which the transparent doors are replaced by air curtains.

FIG. 15 shows the first container 210a which has, on the left-hand side when considering the drawing, the intake 214 enabling it to be supplied with ultraclean compressed gas or air via the pipe 216. It is possible to see the support 212 on which are placed the objects to be treated or transported (e.g., silicon chips). It should be noted that, in this embodiment, the support 212 can be fixed with respect to the first container 210a. Air which has traversed the first container 210a leaves it through the outlet 230 positioned to the right in the drawings.

However, in this embodiment, the doors are eliminated, whilst the outlet 230 is surrounded entirely by a series of nozzles 318 arranged in such a way as to blow ultraclean gas in a direction substantially perpendicular to the direction of the gas traversing the first container 210a from the intake 214 to the outlet 230. If the first container 210a were not supplied by the gas arriving through the pipe 216, the gas leaving through the nozzles 318 would form an air curtain level with the outlet 230. When the first container 210a is supplied by the pipe 216, the two gas jets (i.e., that coming from the pipe 216 and that which is blown in through the nozzles 318) are combined and constitute a flow which leaves the first container 210a through the outlet 230, as symblioized by an arrow 320 shown in broken line form in the drawing.

The sectional view of FIG. 16 shows in greater detail the way in which the device for forming the air curtain level with the outlet 230 is constructed. It is possible to see a wall 322 of the first container 210a, which at certain locations has an inner space 324 linked with the ultraclean gas source. The inner space 234 can communicate with the pipe 216 or it can be linked with the source by other means. A hollow profile 326 is fixed to the inner face of a wall 322 of the first container 210a completely around the outlet 230. On the side of the wall 322, the hollow profile 326 has one or more openings 328 enabling it to be linked with the inner space 324, whilst on the other side, it has a certain number of openings forming the nozzles 318.

FIG. 17 shows the coupling of the two containers constructed in accordance with the embodiment of FIG. 15. The first container, on the left-hand side in FIG. 17, carries the reference 210a, whilst the other on the right-hand side and partly shown in mixed line form, carries the reference 210b. The cross-section of the second container 210b slightly exceeds that of the first container 210a, so that the two containers can penetrate one another. On its outer periphery, each of the two containers has a flange 330 equipped with a positioning and centering system enabling the two containers to be reciprocally perfectly oriented for the transfer of the silicon chips 264. The first container 210a contains the support 212, which can be identical to that illustrated in FIG. 13, and which has tracks or paths 263 on which are arranged the silicon chips 264. The second container 210b contains the support 213, which can be identical to that illustrated in FIG. 13 and which can optionally be fixed with respect to the second container 210b. The dimensions of the containers, the position of the flanges 330, and the position of the supports 212, 213 within these containers are such that, when the containers 210a and 210b are coupled, the supports 212 and 213 are in a position permitting the transfer of the silicon chips 264 from one to the other in accordance with the method described hereinabove.

At the time of coupling the containers 210a, 210b of FIG. 17, the blowing in of air through the nozzles 318 is stopped, the sweeping of the common volume of the two containers being ensured solely by the air coming A cover 268 placed above the first container 210a encloses the gripping and lifting device 252, which essentially comprises an electromagnet 270 connected to the support 212 by a rigid connecting element 272. The electromagnet 270 makes it possible to raise and set down, as required, the support 212 within the first container 210a. A horizontal rod 274 serves as a guide for displacement in horizontal translation of the gripping and lifting device 252. A piston 276, mobile within a cover 278 positioned above the cover 268, is connected by a rod 280 to an element 282 which is connected by a tube 284 to the electromagnet 270. As all the elements 276, 280, 282, 284, and 270 are rigid, the displacement of the piston 276 by not shown motor means leads to the displacement in the same direction of the electromagnet 272. Wires or leads 286 pass along the tube 284 making it possible to supply to the paths 263 of the support 212 the necessary electric power and pressurized gas for the operation of the latter.

FIG. 13 also shows that the cover 268 is separated from the remainder of the first container by a wall 304 having a gap 306 substantially parallel to the horizontal rod 274. The rigid connecting element 272 circulates within the gap 302 when the electromagnet 270 moves from left to right and vice versa with respect to FIG. 13. Within a cover 308 and communicating with the cover 268, the device also has a masking tape 310 mounted on a reel 312. Thus, one of the ends of the masking tape 310 is fixed to the reel 312, whilst its other end is fixed either to the electromagnet 270 or to the rigid connecting element 272. When the gripping and lifting device 252 moves from right to left with respect to FIG. 13, this has the effect of bringing the first container 210a and the cover 268 into communication via the gap 306. However, as one end of the masking tape 310 is fixed to the device, the masking tape 310 covers the gap 306 during that movement, thus limiting any passage of dust from the covers 268 or 308 to the first container 210a. As the cover 308 has an orifice 314 linking it with the outside of the first container 210a (i.e., with the room in which the first container 210a, is located), the air penetrating the first container 210a passes through the orifice 314 into the cover 268 through the gap 306 and then into the cover 308 and from there into the room through the orifice 314.

FIG. 13 also shows that each of the containers 210a and 210b has a recess 260, 262 respectively, in which are located doors 232 and 233, when they are in the open position (FIG. 13 showing the doors in the closed position). A tube 290 having openings 292 is provided within the recess 260 and is linked with the ultraclean gas source. Thus, even when the door 232 is in the open position, the tube 290 makes it possible to blow pressurized ultraclean air into the recess 260, and the orifices of the panels constituting the doors 232, 233 are traversed by a high speed ultraclean gas. Thus, the doors 232, 233 are permanently kept in a highly clean state and, even when the doors are in the open position, it is possible to prevent the deposition of particles thereon.

The doors 232, 233 can, e.g., be constituted by a very fine woven cloth with a transparency between 0.1 and 0.2 which is supported by a rigid frame. This cloth (the thickness of which is approximately 150 to 200 micrometers) can be in any random form can, e.g., be in the shape of a portion of a cylinder or a portion of a sphere. The doors 232, 233 can be made in one or two parts, and the material constituting the cloths can be a metal (woven or fritted) or a plastic (PVDF or polysulphone).

As has been shown hereinbefore, on passing through the door 232, the spread of the air is multiplied by 5 to 10 and therefore any pollution is kept away from the outer face of the panel. The recess 262 for the door 233 of the second container 210b, is identical to the recess 260 for the door 232 of the first container 210a and will consequently not be described in detail here.

FIG. 13 also shows within the recess 260 an electrode 294 placed between the wall of the recess 260 and the door 232, when the latter is in the open position. The electrode 294 can be raised to a given electric potential in order to attract the particles which might accidentally be deposited on the door 232, and it thereby maintains the door 232 in a very high cleaness state.

FIGS. 13 and 14 also show that the door 232 of the first container 210a is integral with a toothed wheel 296 via a spindle 297. The toothed wheel 296 meshes with a pinion 298, which in turn meshes with a toothed wheel 300 integral with the door 233 of the second container 210b via a spindle 301. The toothed wheels 296 and 300, the pinion 298, and a motor 302 are located outside the containers 210a, 210b, making it possible to pivot the toothed wheel 300 and consequently, the pinion 298 and the toothed wheel 296. The spindles 297, 301 tightly traverse the walls of the container 210a, 210b (e.g., by means of a dynamic sealing arrangement or any other known system traversing the walls of the containers 210a, 210b). Thus, the motor 302 controls the simultaneous opening of the doors 232, 233. It is pointed out that, in the embodiment shown here, the recess 260 is located on the lower part of the first container 210a, whilst the recess 262 is located in the upper part of the second container 210b. The movements of the two doors 232, 233 consequently take place in reverse directions on simultaneously opening them or on simultaneously closing them, but it would not fall outside the scope of the invention to use other arrangements.

An operation of transferring silicon chips between the first container 210a and the second container 210b takes place in the following way. Initially, the first container 210a placed on the carriage 247 is remote from the processing machine 246 and, consequently, from the second container 210b. The doors of the two containers are in the closed position, and the support 212 within the first container 210a is in the position illustrated in FIG. 13, i.e., on the left-hand side in that drawing. The chips which were initially located in a not shown storage cabinet have been deposited on the tracks or paths 263 of the support 212. The carriage 247 and the processing machine 246 are moved together until a nose 316 of the first container 210a penetrates nose 317 of the second container 210b.

In the present description, the term "nose" of the container refers to a substantially cylindrical portion thereof positioned downstream of the door with respect to the gas flow direction within the container when the door is in the closed position. In the embodiment illustrated in FIG. 13, the section of the nose 316 of the first container 210a is slightly smaller than the section of the nose 317 of the second contanier 210b. Thus, during coupling, the nose 316 of the first container 210a is located within the nose 317 of the second containter 210b, a space being provided between the outer face of the nose 316 and the inner face of the nose 317.

The two containers are kept for a few instants in this position (i.e. with the doors closed), in order to clean and purge the space between the two doors. This is brought about with the aid of pressurized air introduced into each of the containers. This air traverses the doors, is located in the space between the latter, and is discharged through the gap located between the nose 316 and the nose 317. When this space is sufficiently clean (i.e., a cleanness equal to that prevailing within the containers) the motor 302 is actuated, which leads to the opening of the doors via the toothed wheel 300, the pinion 298, and the toothed wheel 296. Thus, each door is brought into its recess 260 or 262.

The electromagnet 270 is then excited, so that it raises the support 212 and the gripping and lifting device 252 is moved from left to right in FIG. 13. During this movement, the masking tape 310 progressively covers the gap 306. This movement continues until that portion of paths 263 located outside the box 266 is positioned within the support 213. The compressed gas jet used for supporting the silicon chips 264 is oriented in such a way that the chips are moved from left to right in FIG. 13. The dimensions and shape of the support 213 are such that, during this movement, the silicon chips 264 come above spokes provided on the support 213 after leaving the paths 263 of the support 212 and are placed on these spokes when they are no longer maintained in the raised supported position by the compressed air. When all the silicon chips 264 have been transferred in this way, the support 213 can be manipulated within the processing machine 246 and the chips are brought to the working station.

During the operation to be performed on the silicon chips 264, the first container 210a can remain in the coupling position or it can be separated from the second container 210b (e.g., to perform another transfer). It is obvious that, prior to carrying out this separation, it is necessary to bring the support 212 to its starting position and to close the doors of the two containers. The procedure is the same as that which will now be described when it is a question of bringing the silicon chips 264 from the processing machine 246 to the first container 210a.

Prior to performing this transfer in the reverse direction, the two containers are brought into the coupling position, as illustrated in FIG. 13 and the space between the two doors is, purged before opening the latter.

The device 256 (FIG. 12) is then actuated in order to bring the silicon chips 264 into the position 213b of the support 213, and then an elevator brings the support 213 into the position 213a. The gripping and lifting device 252 is started up so as to bring the support 212 to the working positon (i.e., a position where the righthand end of the paths 263 with respect to FIG. 13 is located within the support 213). Compressed air is then blown through the upper wall of each of the paths, so that the silicon chips 264 are raised above the spokes of the support 213 and displaced from right to left to return to their initial position on the paths 263 of the support 212. The gripping and lifting device 252 is then moved from right to left until the support 212 returns to its starting position. The doors 232, 233 are then closed, and the carriage 247 can be moved away from the processing machine 246.

THE THIRD EMBODIMENT

FIGS. 15 to 17 illustrate another embodiment of a container according to the invention in which the transparent doors are replaced by air curtains.

FIG. 15 shows the first container 210a which has, on the left-hand side when considering the drawing, the intake 214 enabling it to be supplied with ultraclean compressed gas or air via the pipe 216. It is possible to see the support 212 on which are placed the objects to be treated or transported (e.g., silicon chips). It should be noted that, in this embodiment, the support 212 can be fixed with respect to the first container 210a. Air which has traversed the first container 210a leaves it through the outlet 230 positioned to the right in the drawings.

However, in this embodiment, the doors are eliminated, whilst the outlet 230 is surrounded entirely by a series of nozzles 318 arranged in such a way as to blow ultraclean gas in a direction substantially perpendicular to the direction of the gas traversing the first container 210a from the intake 214 to the outlet 230. If the first container 210a were not supplied by the gas arriving through the pipe 216, the gas leaving through the nozzles 318 would form an air curtain level with the outlet 230. When the first container 210a is supplied by the pipe 216, the two gas jets (i.e., that coming from the pipe 216 and that which is blown in through the nozzles 318) are combined and constitute a flow which leaves the first container 210a through the outlet 230, as symbloized by an arrow 320 shown in broken line form in the drawing.

The sectional view of FIG. 16 shows in greater detail the way in which the device for forming the air curtain level with the outlet 230 is constructed. It is possible to see a wall 322 of the first container 210a, which at certain locations has an inner space 324 linked with the ultraclean gas source. The inner space 234 can communicate with the pipe 216 or it can be linked with the source by other means. A hollow profile 326 is fixed to the inner face of a wall 322 of the first container 210a completely around the outlet 230. On the side of the wall 322, the hollow profile 326 has one or more openings 328 enabling it to be linked with the inner space 324, whilst on the other side, it has a certain number of openings forming the nozzles 318.

FIG. 17 shows the coupling of the two containers constructed in accordance with the embodiment of FIG. 15. The first container, on the left-hand side in FIG. 17, carries the reference 210a, whilst the other on the right-hand side and partly shown in mixed line form, carries the reference 210b. The cross-section of the second container 210b slightly exceeds that of the first container 210a, so that the two containers can penetrate one another. On its outer periphery, each of the two containers has a flange 330 equipped with a positioning and centering system enabling the two containers to be reciprocally perfectly oriented for the transfer of the silicon chips 264. The first container 210a contains the support 212, which can be identical to that illustrated in FIG. 13, and which has tracks or paths 263 on which are arranged the silicon chips 264. The second container 210b contains the support 213, which can be identical to that illustrated in FIG. 13 and which can optionally be fixed with respect to the second container 210b. The dimensions of the containers, the position of the flanges 330, and the position of the supports 212, 213 within these containers are such that, when the containers 210a and 210b are coupled, the supports 212 and 213 are in a position permitting the transfer of the silicon chips 264 from one to the other in accordance with the method described hereinabove.

At the time of coupling the containers 210a, 210b of FIG. 17, the blowing in of air through the nozzles 318 is stopped, the sweeping of the common volume of the two containers being ensured solely by the air coming from the ultraclean air source, which penetrates through the intakes of each container and is extracted via the space located between the container walls, when the containers are in the coupled position, as illustrated by arrows 334 in FIG. 17. Flanges 330 and 332 can be in several parts or in a single part, and there is always a passage for the air between the flanges 330 and 332 when the containers are coupled together.

Thus, the installation according to the invention has particularly interesting advantages. It is possible to obtain a very high cleanness level within the containers, due to the reduction in the number of elements located within them that can be dust and solid particle generators due to the inevitable friction which they produce. Thus, it is ensured that the microelectronic circuits produced in installations using these containers are of excellent quality because the chips are permanently in an environment the cleanness of which can be guaranteed. Moreover, the production costs are reduced because the volume which has to be maintained at a maximum cleanness level is low compared with the volume of the room in which these operations are performed.

Moreover, in the case of a diameter change of the chips to be processed, it is easy to adapt the equipment because, in the cabinet, it is only necessary to change the racks and the front panel. As a result of the construction of the containers illustrated in FIG. 5, they can be adapted to all types of positions, because the rigid case 82 can be fixed to any random face of the rigid case 96, and the locking container 74, has openings on each face enabling it to adapt to any random machine.

It is also pointed out that the second embodiment (described relative to FIGS. 10 to 17) makes it possible to achieve a higher cleanness level than the first within the installation. Thus, if the external ultraclean gas source is a gas reserve stored under pressure, this makes it possible to use gases other than air, such as nitrogen. The thus stored gases have a higher cleanness level than that of a source of air emanating from a generating station.

Finally, it is obvious that the invention is not limited to the embodiments described hereinbefore, and numerous variants thereof are possible without passing beyond the scope of the invention. Thus, as a function of each particular application, it is possible to modify the precise shape of the containers, the supply means for the same, the shape and dimensions of the chip supports, and the means for transferring the chips from one container to the other.

We claim:

1. Installation for the storage and transfer of objects with a view to the treatment or processing thereof in an extremely clean atomosphere, said installation being adapted to be placed in a room having an average cleanness level, said installation comprising:
    (a) storage means for storing the objects;
    (b) processing means for processing the objects;
    (c) transfer means for transferring the objects between said storage means and said processing means, said transfer means comprising at least one mobile container which can be coupled to said storage means and to said processing means and at least one fixed container for the introduction of the objects into said processing means, said at least one fixed container being couplable to said at least one mobile container, said containers comprising at least one filter having an upstream face and downstream face, said containers also comprising means for producing an overpressure within said containers; and
    (d) ventilation means for circulating the gas contained within said containers so that the gas traverses said at least one filter from the upstream face to the downstream face thereof,
    (e) said means for producing an overpressure and said means for circulating the gas comprising an intake making it possible to link the interior of said installation with an external pressurized, ultra clean gas source.

2. Installation according to claim 1, characterized in that the interior of the installation is maintained under an overpressure with respect to the room in order to obtain dynamic sealing.

3. Installation according to claims 1 or 2, characterized in that:
    (a) the objects have planar surfaces and
    (b) said ventilation means are such that the flow is laminar and parallel to the planar surfaces of the objects.

4. Installation according to claim 3, characterized in that said at least one filter is an absolute filter.

5. Installation according to claim 1, characterized in that said storage means are constituted by a cabinet incorporating at least one filter having an upstream face, a downstream face, and locations for the objects close to the downstream face of said at least one filter, the gaseous flow traversing said at least one filter from the upstream face to the downstream face thereof.

6. Installation according to claim 5, characterized in that said cabinet comprises a first rigid case in which are located locations for the objects and at least one second rigid case in which are located said ventilation means located within cabinet, said first rigid case and said at least one second rigid case being connected to one another by at least one hollow, flexible member able to absorb vibrations.

7. Installation according to claim 5, characterized in that said cabinet has at least one opening for the passage of the objects between the interior and the exterior of said mobile container, whereby said at least one opening can be closed by a door movable between a closed position permitting a passage for the gas from the interior of said mobile container to the exterior.

8. Installation according to claim 7, characterized in that said door is mounted on said cabinet by means of a deformable thin sheet fixed on the one hand to said cabinet and on the other hand to said door.

9. Installation according to claim 7, characterized in that said cabinet also has means for maintaining said door in the closed position.

10. Installation according to claim 9, characterized in that said means for maintaining said door in the closed position comprise a first magnet fixed to said door and a second magnet fixed to said cabinet, the two magnets being in the vicinity of one another when said door is in the closed position.

11. Installation according to claim 10, characterized in that said cabinet comprises a robot which can move in front of a front panel of said storage means in order to open, by means of said magnets, each door of said cabinet, each of which is provided with a front magnet, and said door of said mobile container.

12. Installation according to claim 5, characterized in that said at least one filter is an absolute filter.

13. Installation according to claim 1, characterized in that said fixed and mobile containers have a nose in the form of a hollow parallelepiped, whereof one end communicates with the interior of said containers and whereof the other end has an orifice permitting the passage of the objects, said containers being closed by doors.

14. Installation according to claim 13, characterized in that:
    (a) said mobile container has a parallelepipedic cross-section of its nose and
    (b) said fixed container has a cross-section of its nose differing from that of said mobile container, so that one of the two can penetrate the other.

15. Installation according to claim 14, characterized in that said transfer means comprises:
    (a) a rod having at one of its ends means for gripping one of the objects, said rod being displaceable in translation between a retracted position in which the object is at its location in said fixed container and an extended position in which the object is outside said fixed container and
    (b) means for the displacement in translation of said rod.

16. Installation according to claim 1, characterized in that said containers also have means for producing an overpressure within said containers.

17. Installation according to claim 16, characterized in that said means for producing an overpressure comprise at least one fan positioned so as to blow gas into said containers through orifices provided in the walls of said containers.

18. Installation according to claim 16, characterized in that said means for producing an overpressure and said ventilation means are constituted by an intake making it possible to link the interior of the installation with said external pressurized, ultraclean gas source and a location in said containers positioned in such a way that the objects are swept by the gas circulating within said containers.

19. Installation according to claim 18, characterized in that said containers also have a pressurized gas cleaning system.

20. Installation according to claim 19, characterized in that said pressurized gas cleaning system comprises:
    (a) at least one nozzle connected to said external pressurized, ultraclean gas source and
    (b) means for blowing the gas through said nozzle, the latter being located in such a way as to direct the ultraclean gas towards a given location within the corresponding one of said containers.

21. Installation according to claim 18, characterized in that at least one of said containers also has a door incorporating a panel with an inner face and an outer face and which has small openings and means for displacing said door between a closed position in which said panel closes said outlet and an open position in which said outlet is not closed.

22. Installation according to claim 21, characterized in that said at least one of said containers also comprises:
    (a) a recess separated from the remainder of said at least one of said containers and in which is located said door in the open position, said recess being linked with remainder of said at least one of said containers by a first opening permitting the passage of said door and with the room by a second opening and (b) means for blowing ultraclean gas onto the inner surface of said panel when said door is in said recess.

23. Installation according to claim 22, characterized in that said at least one of said containers also comprises:
    (a) an electrode placed in said recess facing the outer face of said panel when said door is in the open position and
    (b) means for applying an electric potential to said electrode.

24. Installation according to claim 18, characterized in that said at least one of said containers also comprises a grid placed between said inlet and the location of one of the objects, in such a way that the gas sweeping the object passes through said grid.

25. Installation according to claim 24, characterized in that the installation further comprises means for applying an electric potential to said grid.

26. Installation according to claim 18, characterized in that, with an object or objects on said support, the installation further comprises displacement means for displacing said support within said at least one of said containers.

27. Installation according to claim 26, characterized in that said displacement means comprises:
    (a) a cover positioned above a part of said at least one said containers and separated therefrom by a wall;
    (b) at least one orifice linking said cover with the room;
    (c) a gripping and lifting system for said support located in said cover and connected to said support by a connecting member which passes through a gap made in said wall;
    (d) means for displacing said gripping and lifting system within said cover between a rest position and a working position;
    (e) said connecting member remaining in said gap during this movement; and
    (f) a masking tape having a first end fixed to a reel and a second end fixed to said gripping and lifting system, said masking tape progressively covering said gap while remaining at a limited distance from said wall as said gripping and lifting system passes from the rest position to the working position.

28. Installation according to claim 18, characterized in that said at least one of said containers further comprises means for producing an ultraclean gas curtain level with said outlet.

29. Installation according to claim 1, characterized in that said ventilation means comprise fans each of which has a shaft mobile in rotation about its axis, at least one group of blades mounted on said shaft, and a drive motor for rotating said shaft.

30. Installation according to claim 29, characterized in that:
    (a) said drive motors are located outside the installation and
    (b) each shaft traverses at least one wall thereof via an orifice the section of which is larger than that of said shaft.

31. Installation according to claim 29, characterized in that said fans also have at least one hollow cylinder, open at both ends and within which are located said at least one group of blades.

32. Installation according to claim 1, characterized in that the inner surfaces of the installation are covered by a thin layer of the same material that constitutes the objects to be treated.

33. Installation according to claim 1, characterized in that the installation further comprises a device for regulating the temperature and/or the relative humidity inside the installation.

* * * * *